(12) United States Patent
Demers

(10) Patent No.: US 11,733,156 B2
(45) Date of Patent: Aug. 22, 2023

(54) SEMICONDUCTOR PACKAGE FOR FREE-SPACE COUPLING OF RADIATION AND METHOD

(71) Applicant: Joseph R. Demers, Van Nuys, CA (US)

(72) Inventor: Joseph R. Demers, Van Nuys, CA (US)

(*) Notice: Subject to any disclaimer, the term of this patent is extended or adjusted under 35 U.S.C. 154(b) by 349 days.

(21) Appl. No.: 17/183,191

(22) Filed: Feb. 23, 2021

(65) Prior Publication Data

US 2022/0268692 A1 Aug. 25, 2022

(51) Int. Cl.
*G01N 21/31* (2006.01)
*H01L 31/0232* (2014.01)
*H01L 31/0203* (2014.01)

(52) U.S. Cl.
CPC ......... *G01N 21/31* (2013.01); *H01L 31/0203* (2013.01); *H01L 31/02325* (2013.01); *G01N 2201/0636* (2013.01)

(58) Field of Classification Search
CPC ........... G01N 21/31; G01N 2201/0636; G01N 21/3581; G01N 2021/0346; G01N 21/031; H01L 31/0203; H01L 31/02325
See application file for complete search history.

(56) References Cited

U.S. PATENT DOCUMENTS

| | | |
|---|---|---|
| 5,223,716 A | 6/1993 | Rossiter |
| 5,440,143 A | 8/1995 | Carangelo et al. |
| 5,485,276 A | 1/1996 | Bien et al. |
| 5,493,405 A * | 2/1996 | Hulme ............... G01N 21/05 250/576 |
| 5,905,271 A | 5/1999 | Wynn |
| RE36,489 E | 1/2000 | Alexay |
| 6,512,223 B1 | 1/2003 | Wynn |
| 6,657,199 B2 | 12/2003 | Frederick et al. |
| 6,734,961 B2 | 5/2004 | Gerner et al. |
| 6,867,857 B2 | 3/2005 | Hobbs |
| 6,872,937 B2 | 3/2005 | Williams et al. |
| 7,154,098 B2 | 12/2006 | Clarke et al. |
| 7,244,939 B2 | 7/2007 | Stuttard |
| 7,288,770 B2 | 10/2007 | Gamiles et al. |
| 7,352,464 B2 | 4/2008 | Chen et al. |
| 7,369,226 B1 | 5/2008 | Hewitt |
| 7,446,317 B2 | 11/2008 | Doyle |
| 7,507,969 B1 | 3/2009 | Jones et al. |
| 7,535,005 B2 | 5/2009 | Demers |
| 7,936,453 B2 | 5/2011 | Logan, Jr. et al. |

(Continued)

FOREIGN PATENT DOCUMENTS

WO 2014145120 A1 9/2014

*Primary Examiner* — S M Sohel Imtiaz
(74) *Attorney, Agent, or Firm* — Pritzkau Patent Group LLC

(57) ABSTRACT

A sample cell includes an annular support surrounding a sample region. A set of reflectors of the annular support define an optical path that reflects a source beam in a sequence of alternating directions through the sample region at a plurality of different angles such that the source beam exits the set of reflectors after having passed through the sample region a plurality of times. A micro-cell is positionable in the sample region including multi-dimensionally distributed nano-pores. A slidingly adjustable lens forms part of source and detector photomixing packages.

21 Claims, 14 Drawing Sheets

(56) References Cited

U.S. PATENT DOCUMENTS

| | | |
|---|---|---|
| 7,973,923 B2 | 7/2011 | Wynn et al. |
| 8,018,981 B2 | 9/2011 | Eckles et al. |
| 8,049,884 B2 | 11/2011 | Tsukuda |
| 8,299,433 B2 | 10/2012 | Majewski et al. |
| 8,507,862 B2 | 8/2013 | Noone et al. |
| 8,637,826 B2 | 1/2014 | Menge |
| 8,716,666 B1 | 5/2014 | Demers et al. |
| 8,842,282 B2 | 9/2014 | Keller et al. |
| 9,018,591 B2 | 4/2015 | Herr et al. |
| 9,086,374 B1 | 7/2015 | Demers et al. |
| 9,250,175 B1 | 2/2016 | McManus |
| 9,279,746 B2 | 3/2016 | Wynn |
| 9,297,758 B2 | 3/2016 | Frigo |
| 9,400,214 B1 | 7/2016 | Demers et al. |
| 9,677,983 B2 | 6/2017 | Spriggs |
| 9,848,761 B2 | 12/2017 | Demers et al. |
| 9,998,236 B2 | 6/2018 | Strong et al. |
| 10,094,781 B2 | 10/2018 | Sharma et al. |
| 10,139,344 B2 | 11/2018 | Kovriguine |
| 10,267,947 B2 | 4/2019 | Guo et al. |
| 10,352,865 B1 | 7/2019 | Yelvington et al. |
| 10,436,709 B2 | 10/2019 | Kompaniets et al. |
| 10,488,258 B2 | 11/2019 | Keller et al. |
| 10,495,578 B2 | 12/2019 | Sharma et al. |
| 10,525,153 B2 | 1/2020 | Kim et al. |
| 10,571,393 B2 | 2/2020 | Zheng et al. |
| 10,753,866 B2 | 8/2020 | Klose |
| 11,060,971 B2 | 7/2021 | Mannebach |
| 11,307,311 B2 | 4/2022 | Leder et al. |
| 11,313,779 B2 | 4/2022 | Kopansky et al. |
| 2003/0081206 A1 | 5/2003 | Doyle |
| 2004/0004720 A1 | 1/2004 | Cliche et al. |
| 2004/0240767 A1* | 12/2004 | Kimura ................ G02B 6/4218 385/11 |
| 2008/0252881 A1 | 10/2008 | Yakimoski et al. |
| 2009/0015843 A1 | 1/2009 | Demers et al. |
| 2009/0051901 A1 | 2/2009 | Shen et al. |
| 2009/0257054 A1* | 10/2009 | Hargis ................ G01N 21/6402 356/246 |
| 2009/0283680 A1 | 11/2009 | Logan, Jr. et al. |
| 2010/0073643 A1* | 3/2010 | Nasukawa ............. G03B 21/28 353/88 |
| 2010/0148069 A1 | 6/2010 | Ouchi |
| 2010/0220315 A1* | 9/2010 | Morrell ............. G01N 15/1436 356/73 |
| 2010/0221838 A1 | 9/2010 | Burgess et al. |
| 2010/0277726 A1 | 11/2010 | Logan, Jr. et al. |
| 2010/0314545 A1 | 12/2010 | Logan, Jr. et al. |
| 2011/0048964 A1 | 3/2011 | Luebke et al. |
| 2011/0133090 A1 | 6/2011 | Demers et al. |
| 2012/0061579 A1 | 3/2012 | Wynn |
| 2012/0119101 A1 | 5/2012 | Wynn |
| 2013/0003045 A1 | 1/2013 | Wilkins |
| 2013/0198978 A1 | 8/2013 | Pohlman et al. |
| 2013/0215412 A1 | 8/2013 | Wynn |
| 2014/0160474 A1 | 6/2014 | Keller et al. |
| 2015/0001425 A1* | 1/2015 | Fix ........................ G01N 21/31 250/552 |
| 2015/0192517 A1* | 7/2015 | Andre .................. G01N 21/031 250/343 |
| 2015/0219571 A1 | 8/2015 | Demers |
| 2018/0011003 A1 | 1/2018 | Baum et al. |
| 2018/0374981 A1* | 12/2018 | Carr ....................... H01L 31/147 |
| 2022/0244218 A1* | 8/2022 | Maher ............. G01N 27/44721 |

\* cited by examiner

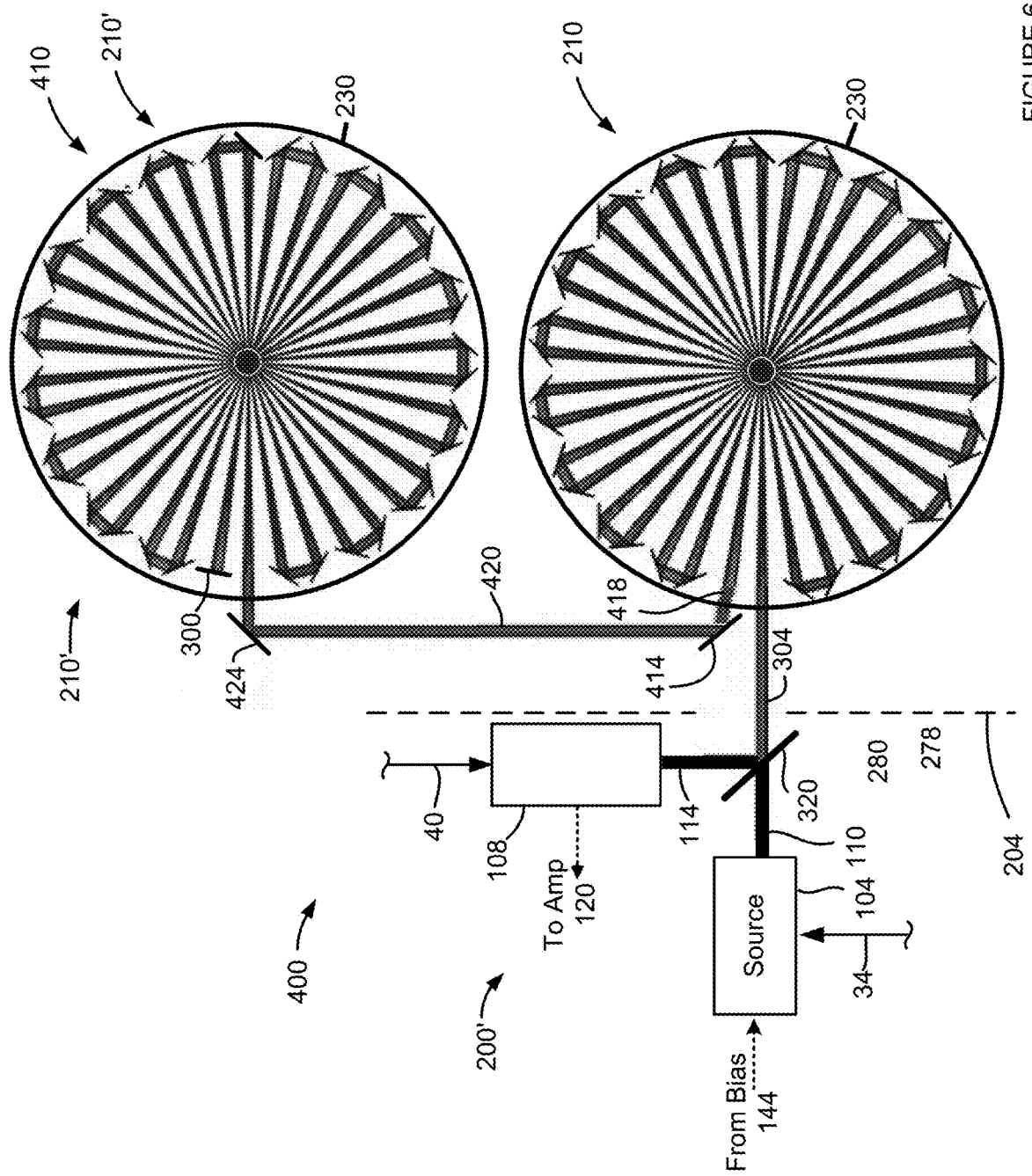

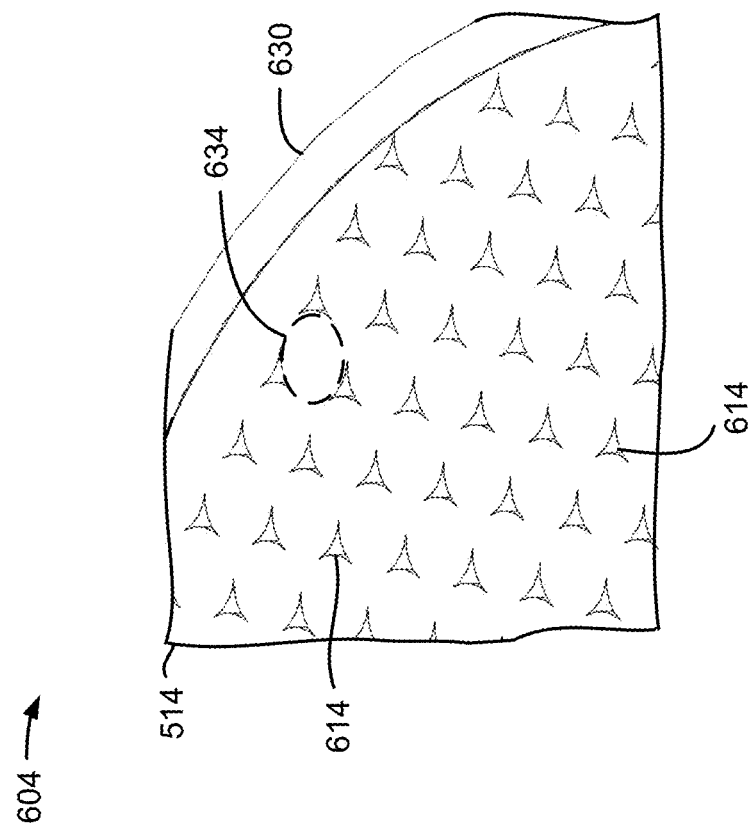
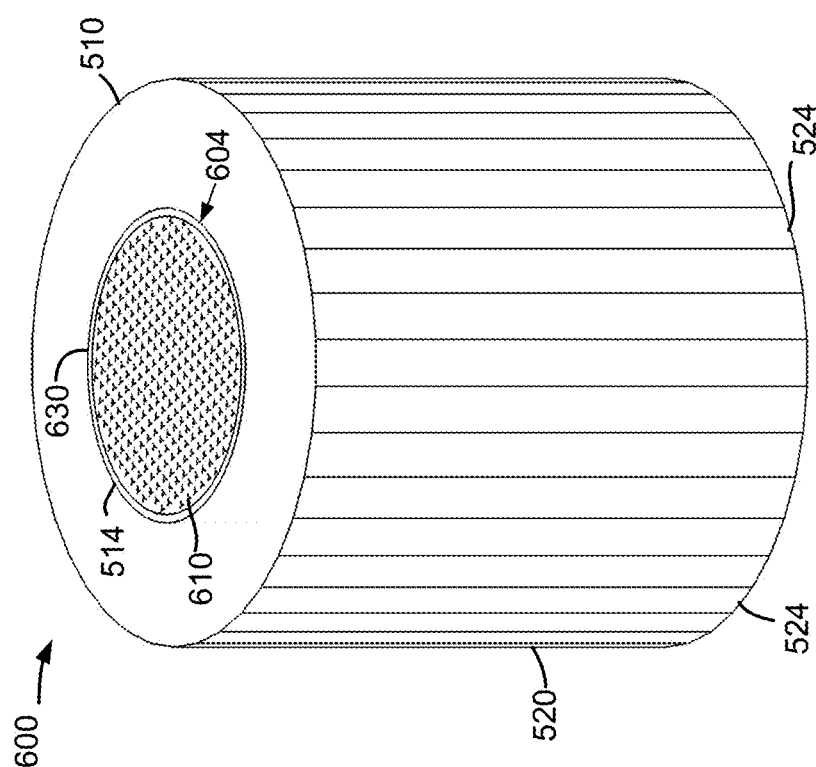

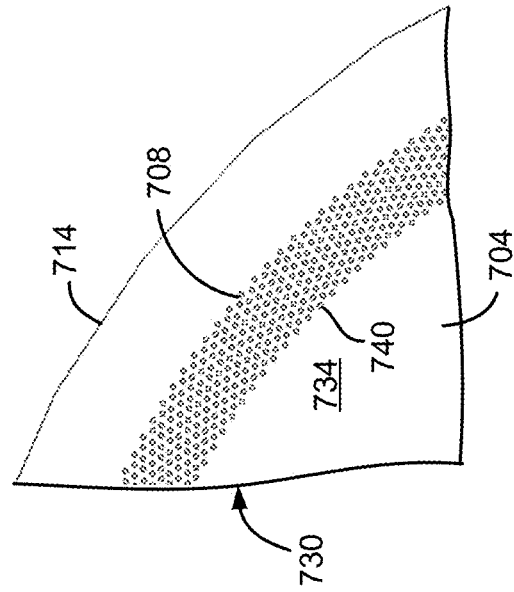
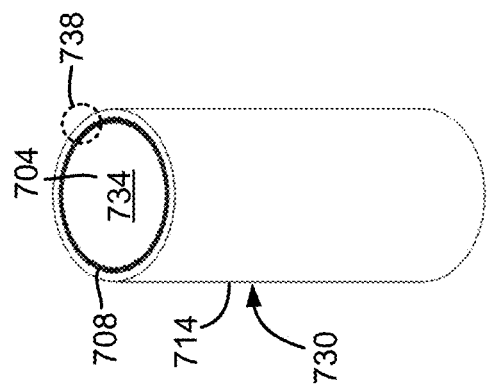
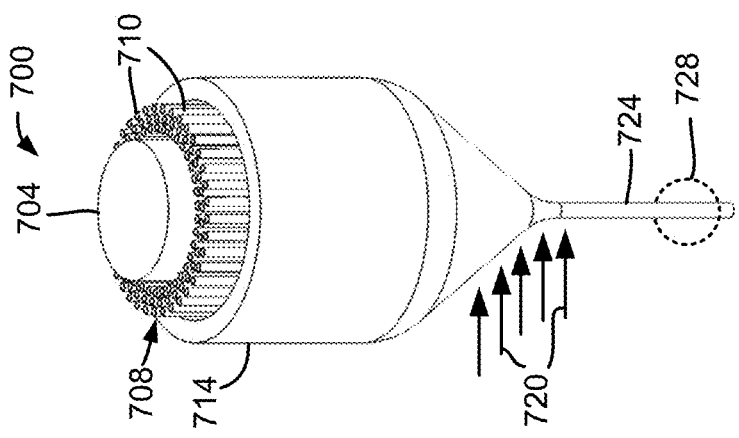
FIGURE 13c
FIGURE 13b
FIGURE 13a

SEMICONDUCTOR PACKAGE FOR FREE-SPACE COUPLING OF RADIATION AND METHOD

STATEMENT REGARDING FEDERALLY SPONSORED RESEARCH OR DEVELOPMENT

This invention was made with Government support under program 1831168 awarded by the National Science Foundation. The Government has certain rights in this invention.

BACKGROUND

The present invention is generally related to the field of spectroscopy and, more particularly, to a multi-pass spectroscopy apparatus, packages for coupling radiation into and from a semiconductor device, sample holder and related methods.

FIG. 1a is a block diagram of a photomixing spectrometer system, generally indicated by the reference number 10, and configured in accordance with the prior art. It is noted that such a system can be employed for terahertz (THz) radiation production and detection. System 10 has been presented for purposes of providing a framework for the discussion of problems which can arise in the prior art, but which are not limited to the field of spectroscopy. System 10 includes a first laser 12 and a second laser 14 which are optically coupled to a fiber optic 2×2 optical coupler 16 through optical fibers 18 and 20, respectively. A first output 24 is optically coupled to a source photomixer 30 through an optical fiber 34 and to a detector photomixer 38 through an optical fiber 40. The source and detector photomixers are positioned relative to a sampling region 50 in which a sample material 52 is positioned. Detector photomixer 38 is electrically connected to a detection circuit 54 through an electrical cable 58.

First laser 12 and second laser 14 can be semiconductor diode lasers, such as distributed feedback (DFB) lasers, that each produce optical radiation at a different single frequency from one another at any given time. The first laser can generate a first optical radiation 60 and the second laser can generate a second optical radiation 64, wherein the optical radiation is represented using arrows. The optical frequency of the light from either one or both of the lasers can be controlled by changing the temperature of one or both of the lasers; and the difference between the optical frequencies is in the frequency range of 1 kHz to over 5 THz. Fiber optic coupler 16 receives optical radiation 60 and 64 from the lasers and optically outputs a combined optical radiation 70 on both outputs that is made up of optical radiation 60 and 64. The source and detector photomixers can be low-temperature grown GaAs photo conductive mixers. The source and detector photomixers receive combined optical power 70 and optically photomix the optical radiation from the two lasers to produce and detect THz radiation, respectively. The source photomixer includes a biased antenna (not shown), and the mixing of the optical radiation on the biased antenna of the source photomixer generates a THz beam 74 that is radiated toward sample region 50. The mixing of the optical radiation on the detector photomixer, which is unbiased, provides a local oscillator required for homodyne detection. The THz radiation generated by the source photomixer can be swept through a range of frequencies by changing the frequency difference between the optical frequencies. The THz beam is directed from the source photomixer through sample region 50 in which the beam interacts with material 52 before traveling to detector photomixer 38 as a modified THz energy subject to interaction with sample 52. In the detector photomixer, modified THz radiation 80 is mixed with the local THz radiation generated by mixing combined optical radiation (i.e., the local oscillator) 70 and is down-converted to an electrical signal 84 (shown as an arrow). The detector signal is supplied to detection circuit 54 over electrical cable 58. The detection circuit receives the detector signal and produces a response that can be used to generate an output that is characterized by the presence of sample material 52. The terahertz frequencies applied to the sample material in the present embodiment can be in a range from about 50 GHz to 3 THz.

Still referring to FIG. 1a, Applicant recognizes that the amount of influence that sample material 52 has on THz beam 74 can be very limited, given that the beam passes through the sample material only one time. Generally, the prior art has attempted to address this problem by increasing the thickness of the sample. Applicant recognizes that this is of limited value, if the molecule of interest resides in a highly absorbent compound, since increasing the thickness will result in complete absorption of the beam and obfuscation of the molecular interaction with the beam. For example, many molecules of biological importance need to be measured while in an aqueous solution. However, water is extremely absorbent and therefore makes characterizing biological compounds very difficult. Simply increasing the path length without somehow removing the water will result in a complete loss of signal.

FIG. 1b illustrates an embodiment of a standard photomixer package that can be incorporated into prior art system 10, generally indicated by the reference number 82 and diagrammatically shown in an elevational view. The basic structure that is shown can serve as either source photomixer 30 and/or detector photomixer 38 of FIG. 1a. For purposes of brevity, the use of this structure as source photomixer 30 will be described. Optical power 83 is received, for example, from optical fiber 34 and focused onto a photomixer chip 85 which itself is fixedly attached to a silicon lens 86. THz radiation 87, for example, can be produced by chip 85, collected by lens 86 and externally emitted by the lens. Applicant recognizes that there are at least two significant issues with this architecture. The first issue is that the center of photomixer chip 85 must be aligned very precisely with the center of lens 86. If the photomixer is offset, the THz beam leaving the photomixer is directed at a corresponding angle α from a centerline 88 of silicon lens 86. Relaxing the positional tolerance on the placement of the photomixer essentially means that any instrument employing photomixers requires a second lens 90 or a mirror (not shown) to correct pointing variation from device to device to a desired direction 91. The second issue that Applicant recognizes concerns an impact on device versatility and production. Because photomixer chip 85 is sitting against a front surface 92 of silicon lens 86, the choice of lens is required at the time of device manufacture and cannot subsequently be changed. In this regard, Applicant recognizes that it is not uncommon for a device end user to request an optical system that focuses output beam 91 instead of collimating the beam. This can lead to the need for a custom packaging run, which can be costly and time consuming.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In general, embodiments and methods are described relating to a sample cell for use as part of a spectrometer including a source which generates a source beam that includes electromagnetic radiation for characterizing a sample that is within a sample region. In an embodiment of the sample cell, an annular support surrounds the sample region for receiving the source beam along an entrance path such that the source beam initially passes through the sample region and the sample contained in the sample region. A set of reflectors is supported by the annular support to define an optical path that reflects the source beam, after initially passing through the sample region, in a sequence of alternating directions through the sample region at a plurality of different angles such that the source beam exits the set of reflectors after having passed through the sample region and any sample contained therein a plurality of times.

In another aspect of the present disclosure, embodiments of an apparatus and associated methods are described in relation to a spectrometer including a source which generates a source beam that includes electromagnetic energy for characterizing a sample that is supported in a sample region. The apparatus includes a micro-cell having an outer periphery including a length extending between a first end and a second end such that an interior portion of the micro-cell serves as the sample region, and the micro-cell defines a plurality of nano-pores for receiving the sample, each nano-pore having an elongated dimension extending at least generally along a direction of the length and the nano-pores are distributed along two orthogonal dimensions transverse to the length.

In another aspect of the present disclosure, embodiments of an apparatus and associated methods are described in relation to a spectrometer including a source which generates a source beam that includes electromagnetic energy for characterizing a sample that is supported in a sample region. The apparatus includes an annular support surrounding the sample region for receiving the source beam along an entrance path such the source beam initially passes through the sample region and the sample contained in the sample region. A set of reflectors is supported by the annular support to define an optical path that reflects the source beam, after initially passing through the sample region, in a sequence of alternating directions through the sample region and at a plurality of different angles such that the source beam exits the set of reflectors after having passed through the sample region and any sample contained therein a plurality of times. A micro-cell is supported within the sample region, the micro-cell having an outer periphery confronting the set of reflectors and the outer periphery includes a length extending between a first end and a second end such that an interior portion of the sample cell serves as the sample region by receiving the sample within a plurality of nano-pores, each nano-pore having an elongated dimension extending at least generally along a direction of the length and the nano-pores are distributed along two orthogonal dimensions transverse to the length.

In another aspect of the present disclosure, an assembly and associated methods are described in which a port is supported for accepting an optical power. A semiconductor device is supported for receiving the optical power from the port and mixing the optical power to produce an emitted radiation. A window includes first and second opposing major surfaces with a thickness therebetween and the window is fixedly supported adjacent to the semiconductor device to place the first opposing major surface in a confronting relationship with the semiconductor device for receiving the emitted radiation and the second opposing major surface is outwardly facing with respect to the semiconductor device such that the emitted radiation passes through the window and exits from the second opposing major surface. A lens is at least initially selectively positionable on the second, outwardly facing major surface of the window for selective alignment with the semiconductor device through the window based on sliding engagement between an input surface of the lens and the second opposing major surface of the window such that the emitted radiation enters the lens from the window and an angular orientation of the emitted radiation exiting from the lens is adjustable responsive to sliding engagement of the lens on the window which changes the selective alignment.

In another aspect of the present disclosure, an assembly and associated methods are described in which a semiconductor device is supported for receiving electromagnetic radiation and generating an electrical signal based on the electromagnetic radiation. A window includes first and second opposing major surfaces with a thickness therebetween and the window is fixedly supported adjacent to the semiconductor device to place the first opposing major surface in a confronting relationship with the semiconductor device with the second opposing major surface outwardly facing with respect to the semiconductor device. A lens is at least initially selectively positionable on the second, outwardly facing major surface of the window for selective alignment with the semiconductor device through the window based on sliding engagement between a planar surface of the lens and the second opposing major surface wherein the electromagnetic radiation is captured by the lens at an angular orientation that is adjustable responsive to sliding engagement of the lens on the window which changes the selective alignment and, thereafter, the optical power passes through the window to the semiconductor device.

In another aspect of the present disclosure, an assembly and associated methods are described in which a semiconductor device is supported for receiving electromagnetic radiation and generating an electrical signal based on the electromagnetic radiation. The assembly includes a port that is supported for accepting an optical power. A semiconductor device is supported for receiving the optical power from the port and mixing the optical power to produce an emitted radiation. A window having first and second opposing major surfaces with a thickness therebetween is fixedly supported adjacent to the semiconductor device to place the first opposing major surface in a confronting relationship with the semiconductor device for receiving the emitted radiation and the second opposing major surface is outwardly facing with respect to the semiconductor device. The emitted radiation passes through the window and exits from the second opposing major surface. A lens is at least initially selectively positionable on the second, outwardly facing major surface of the window for selective alignment with the semiconductor device through the window based on sliding engagement between an input surface of the lens and the second opposing major surface of the window such that the emitted radiation enters the lens from the window and an angular orientation of the emitted radiation exiting from the lens is adjustable responsive to sliding engagement of the lens on the window which changes the selective alignment.

In a continuing aspect of the present disclosure, an assembly and associated methods are described in which a semiconductor device is supported for receiving electromagnetic radiation and generating an electrical signal based on the electromagnetic radiation. The assembly includes a semiconductor device that is supported for receiving electromagnetic radiation and generating an electrical signal based on the electromagnetic radiation. A window having first and second opposing major surfaces with a thickness therebetween is fixedly supported adjacent to the semiconductor device to place the first opposing major surface in a confronting relationship with the semiconductor device and the second opposing major surface is outwardly facing with respect to the semiconductor device such that a lens is at least initially selectively positionable on the second, outwardly facing major surface of the window for selective alignment with the semiconductor device through the window based on sliding engagement between a planar surface of the lens and the second opposing major surface, wherein the electromagnetic radiation is captured by the lens at an angular orientation that is adjustable responsive to sliding engagement of the lens on the window which changes the selective alignment and, thereafter, the optical power passes through the window to the semiconductor device.

BRIEF DESCRIPTIONS OF THE DRAWINGS

Example embodiments are illustrated in referenced figures of the drawings. It is intended that the embodiments and figures disclosed herein are to be illustrative rather than limiting.

FIG. 1b is a diagrammatic view of a prior art photomixing package that can be used in the photomixing spectrometer system of FIG. 1a.

FIG. 6 is a diagrammatic illustration of another embodiment of a modified system which includes a dual multi-pass sampling apparatus in accordance with the present disclosure.

FIG. 11 is a diagrammatic illustration, in a perspective view, of an embodiment of a micro-cell produced in accordance with the present disclosure.

FIG. 12 is a further enlarged diagrammatic, fragmentary view of a portion of the top/end surface of the nano-fluidic cell of FIG. 11, illustrating the potential appearance of individual nano-pores.

FIGS. 13a and 13b diagrammatically illustrate, in perspective views, the production and structure of another embodiment of a nano-fluidic cell in accordance with the present disclosure.

FIG. 13c is a diagrammatic, fragmentary and further enlarged view of a portion of an end face of an embodiment of a photonic rod that is shown in FIG. 13b, in accordance with the present disclosure.

Figure 14B:
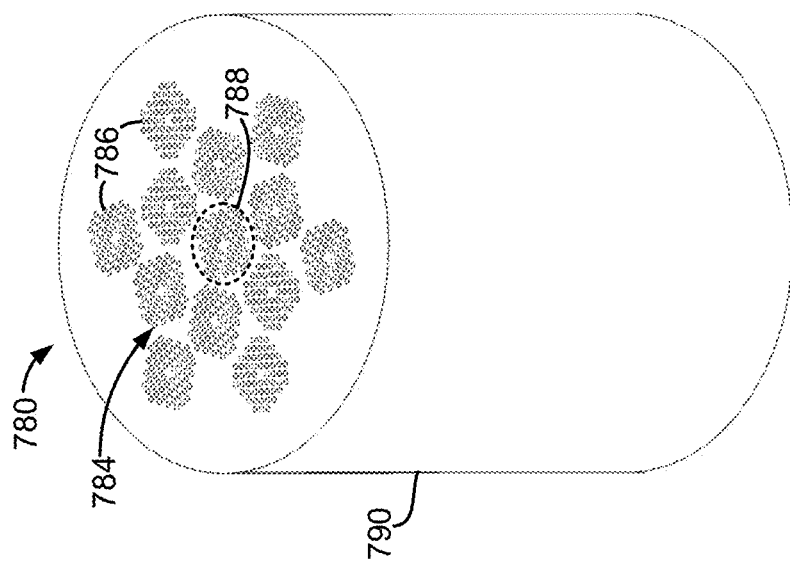
Figure 14A:
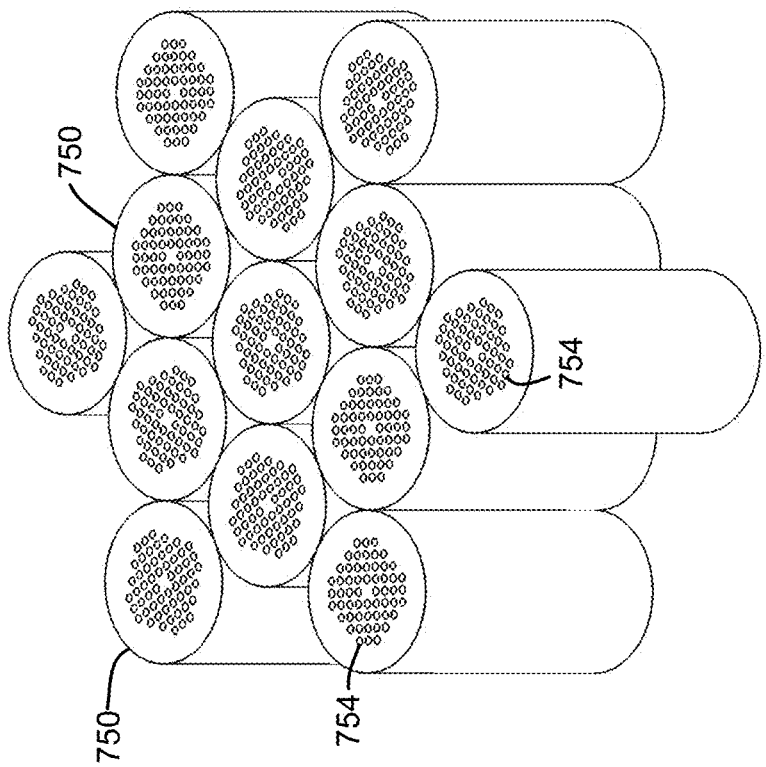

FIGS. 14a and 14b diagrammatically illustrate the production and structure for still another embodiment of a nano-fluidic cell in accordance with the present disclosure.

Figure 15:
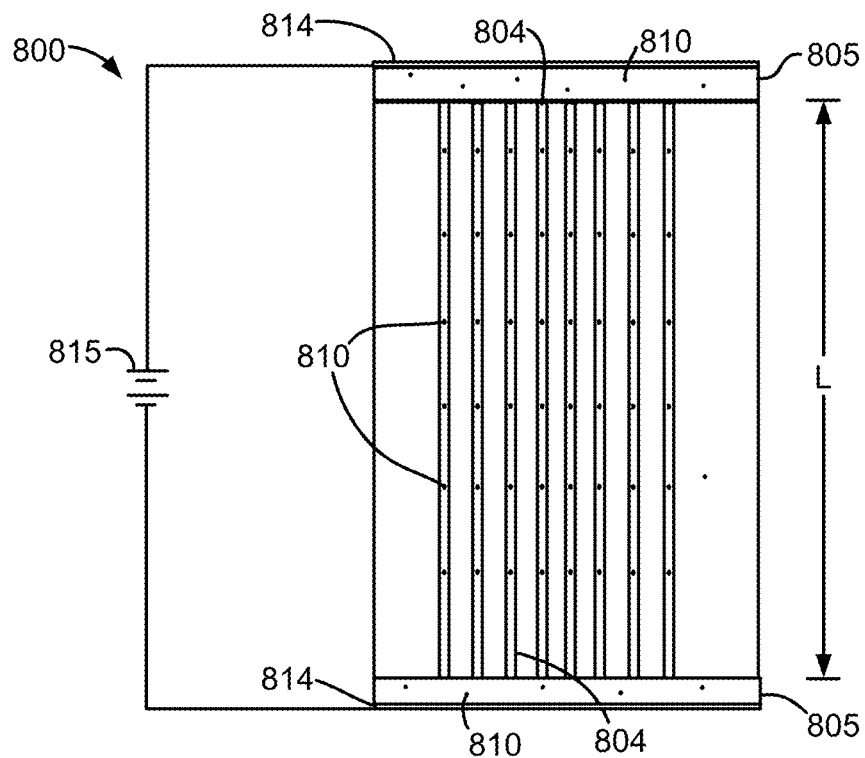

FIG. 15 is an elevational diagrammatic, cut-away view of an embodiment of a nano-fluidic cell, in which a sample is sealed within nano-pores in accordance with the present disclosure.

Figure 16:
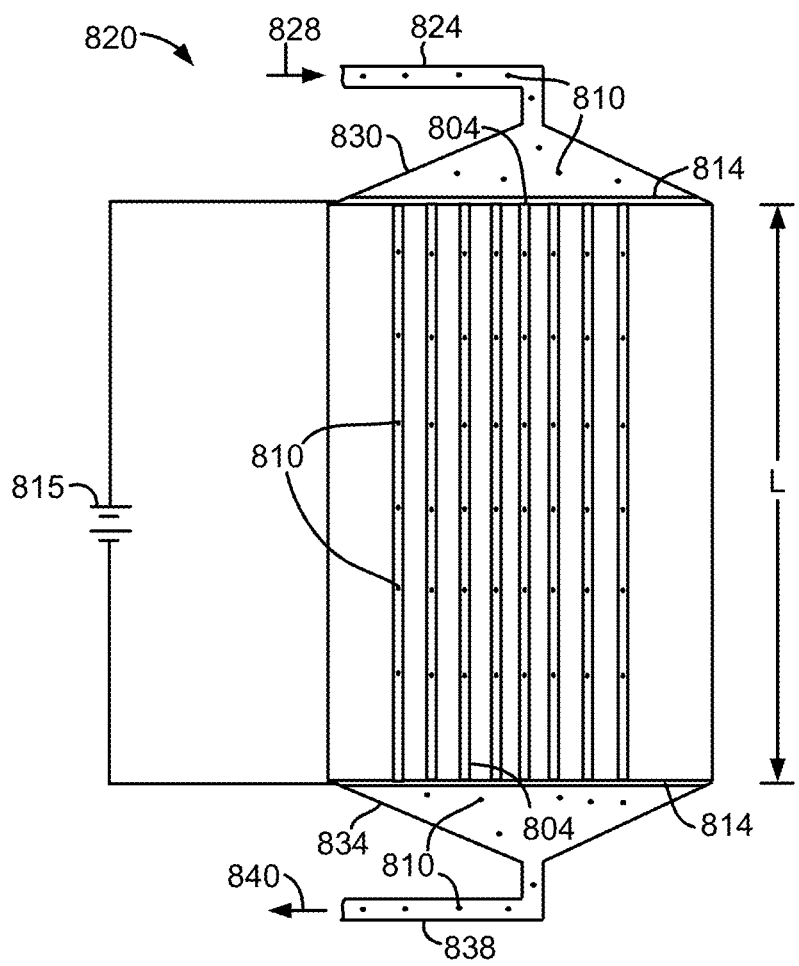

FIG. 16 is an elevational diagrammatic, cut-away view of an embodiment of a nano-fluidic cell, in which a sample flows through nano-pores in accordance with the present disclosure.

Figure 17:
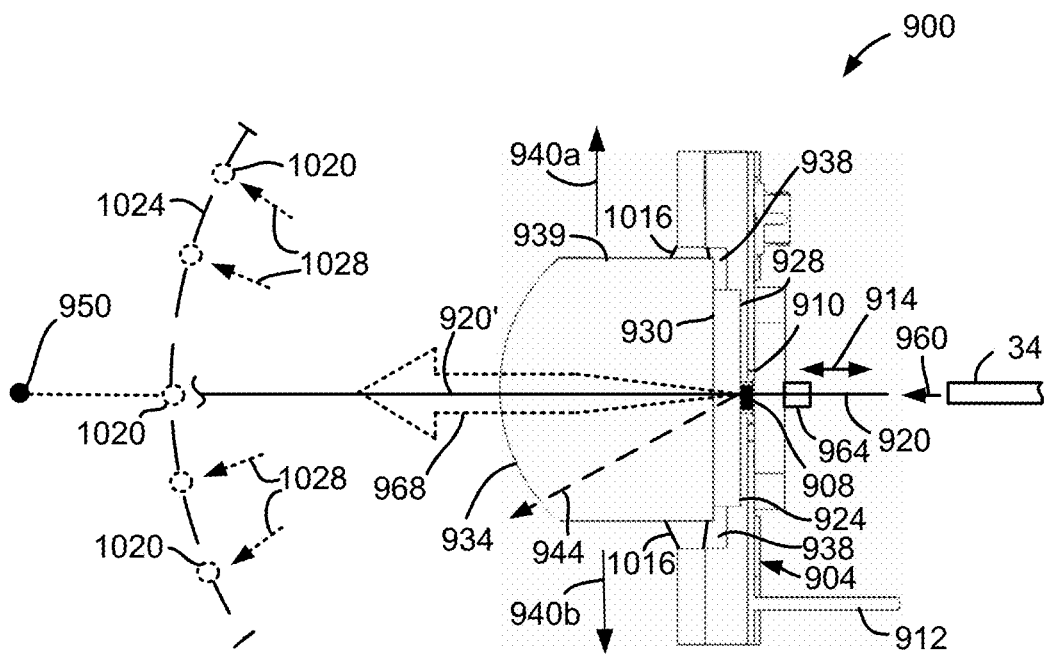
Figure 18:
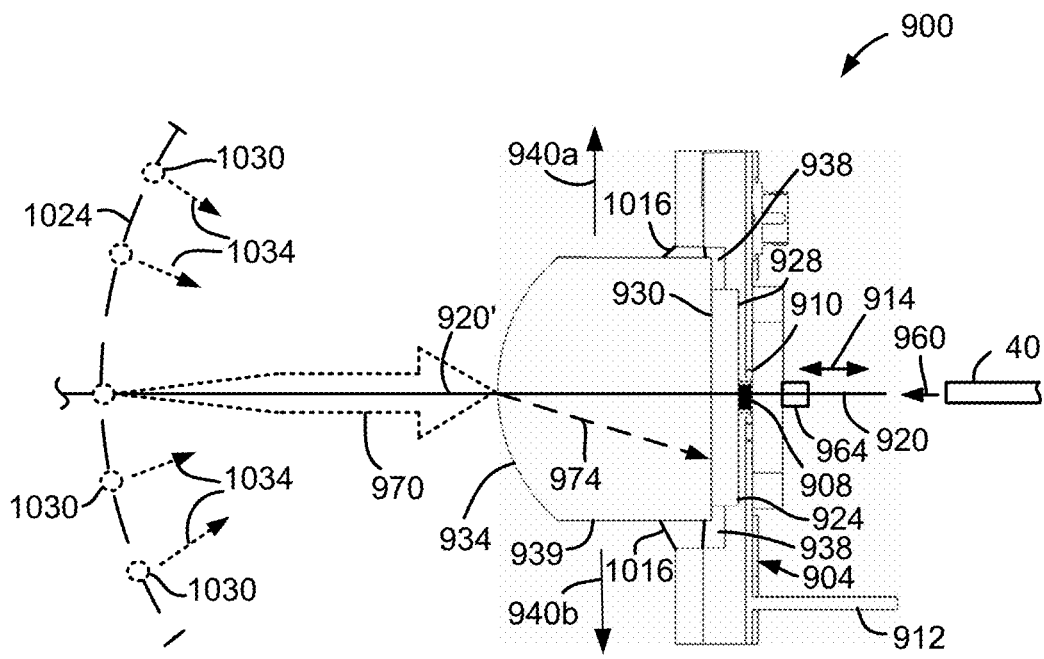

FIGS. 17 and 18 illustrate diagrammatic views, in elevation, of a photomixing package produced in accordance with the present disclosure and its associated operation.

Figure 19:
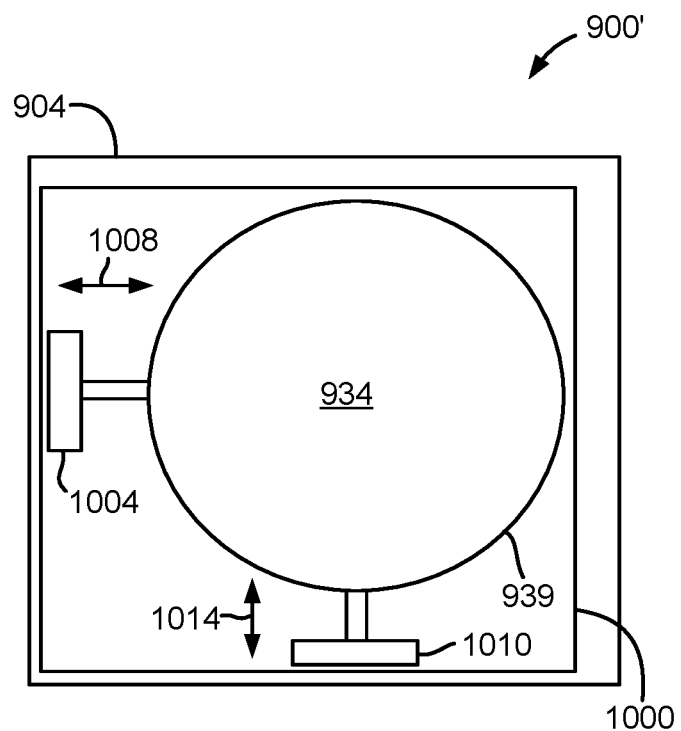

FIG. 19 is a diagrammatic plan view of a modified photomixing package based on the photomixing package of FIGS. 17 and 18.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles taught herein may be applied to other embodiments. Thus, the present invention is not intended to be limited to the embodiment shown, but is to be accorded the widest scope consistent with the principles and features described herein including modifications and equivalents, as defined within the scope of the appended claims. It is noted that the drawings are not to scale and are diagrammatic in nature in a way that is thought to best illustrate features of interest. Descriptive terminology may be used with respect to these descriptions, however, this terminology has been adopted with the intent of facilitating the reader's understanding and is not intended as being limiting. Further, the figures are not to scale for purposes of illustrative clarity.

Figure 2:
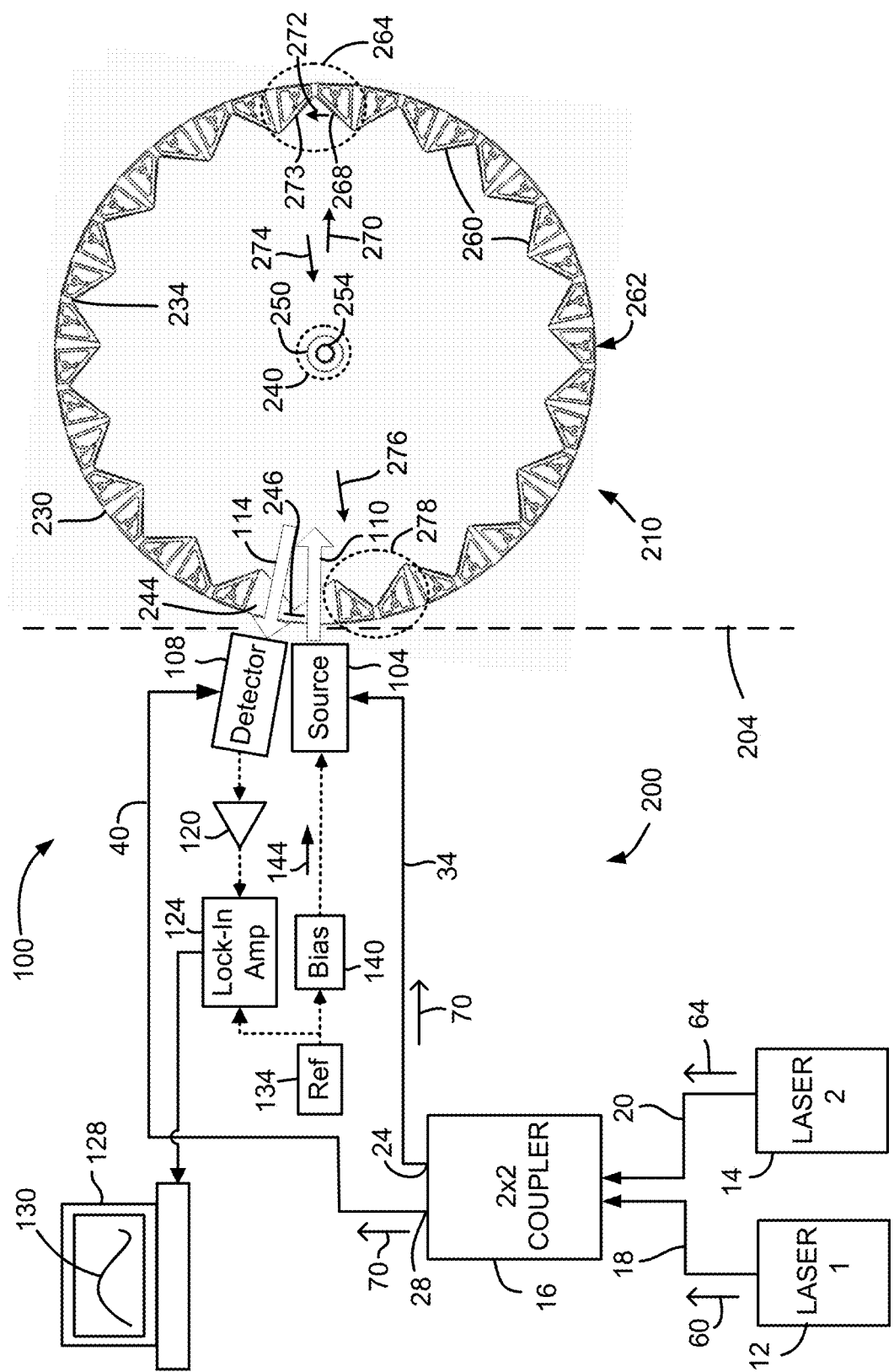
FIG. 2 is a block diagram of an embodiment of a sample analysis system, diagrammatically showing a multi-pass sampling apparatus configured in accordance with the present disclosure.

FIG. 2 is a block diagram of an embodiment of a sample analysis system, generally indicated by the reference number 100, and configured in accordance with the present disclosure. In the present embodiment a spectrometry system is shown, although this is not intended to be limiting based on the discussions that follow. To the extent that the components of system 100 reflect the features of system 10, described above, descriptions of like components may not be repeated for purposes of brevity and like reference numbers may be applied. A source 104 and a detector 108 can be, by way of non-limiting example, photomixers, photoconductive switches (PCSs), diodes or any suitable component either currently available or yet to be developed, that mixes combined optical radiation 70 at two different wavelengths to generate a difference frequency. The source and detector photomixers are generally arranged side-byside such that the source generates a source (i.e., pre-sample) radiation 110, which may be referred to as a source beam, and the detector receives a post-sample radiation 114, both of which are illustrated by arrows. In the present embodiment, the source photomixer can generate source radiation 110 as THz energy, based on a bias, while the detector photomixer can be unbiased. THz radiation generated by the source photomixer can be swept through a range of frequencies by changing a frequency difference between the optical frequencies.

Still referring to FIG. 2, detector 108 is electrically coupled to a sensitive current detection circuit that is made up of an amplifier 120 that is coupled to a lock-in amplifier 124 which provides an output to a computer 128 that can generate results 130. The lock-in amplifier also receives an input from a reference oscillator 134 that generates a low frequency reference signal which is also supplied to a bias amplifier 140. The bias amplifier provides an AC bias at a reference frequency to source photomixer 104. Amplifier 120 increases the signal level from detector photomixer 108 and feeds the signal into lock-in amplifier 124. Computer 128 records the output from the lock-in amplifier 124 and displays output 130 as a function of time or frequency.

The components of system 100 described thus far can be thought of as a sample interrogation system 200 to the left of a dashed vertical line 204 in the view of the figure. The objective of sample interrogation system 200 is to generate source, pre-sample radiation 110 and detect post-sample radiation 114. It is noted that, while sample interrogation system 200 illustrates a frequency domain spectroscopy system, this is not a requirement. In this regard, a time domain system can be used as sample interrogation system 200 with equal applicability. To the right of line 204, system 100 further includes a multi-pass sampling apparatus, an embodiment of which is illustrated, as produced in accordance with the present disclosure, diagrammatically shown in a plan view and generally indicated by the reference number 210. As will be appreciated, based on the discussions that follow, multi-pass sampling apparatus 210 of the present disclosure can be utilized in any system that is capable of generating source (i.e., pre-sample) radiation 110 and then detecting post-sample radiation 114 for analysis purposes and is not limited, for example, to spectroscopy.

Multi-pass sampling apparatus 210 of FIG. 2 includes an annular support 230 that defines an inner periphery 234 surrounding a sample region 240 that is illustrated as a dashed circle centered within annual support 230. In the present embodiment, the inner periphery is at least generally circular, although any suitable shape can be used. The annular support can be formed from any suitable materials including, but not limited to aluminum and in any suitable manner such as, for example, by machining. In the present embodiment, the annular support is a framework that defines an aperture or opening 244 for receiving source beam 110 therethrough and for allowing post-sample radiation 114 to travel to detector 108. In another embodiment, a partition 246 can be provided such that an exit aperture is provided separate from an entrance aperture. The source beam travels to sample region 240 to be incident upon a sample carrier or holder or 250 and a sample 254 that is supported by the sample carrier. It is noted that the sample holder can be employed for holding liquids, solids, corrosive gasses or other compounds that should not interact with the interior of the sample chamber and/or annular support as well as related components, yet to be described.

Annular support 230 is configured to support a plurality of mirrors 260 around inner periphery 234. In combination, annular support 230 and mirrors 260 may be referred to as a multi-path mirror ring 262. Mirrors 260 are configured to cooperate as pairs with an example pair of mirrors 264 shown within a dashed ellipse. In the present embodiment, there are 18 mirror pairs, although any suitable number can be used. As will be seen, a first mirror 268 of each pair initially receives radiation 270 that has traveled through sample region 240 and sample holder 250. The first mirror then reflects the radiation as intermediate radiation 272 to a second mirror 273 of the pair which then directs the radiation back to the center of the sample region as focused radiation 274. Focused radiation 274 then travels through the sample region and sample 254 as post-sample radiation 276 that has traveled through the sample two times to a second pair of mirrors 278. Reflection then continues stepwise in alternating directions through the sample and around the periphery of the annular support in this manner to form an overall multi-pass beam path, described immediately hereinafter.

Figure 3:
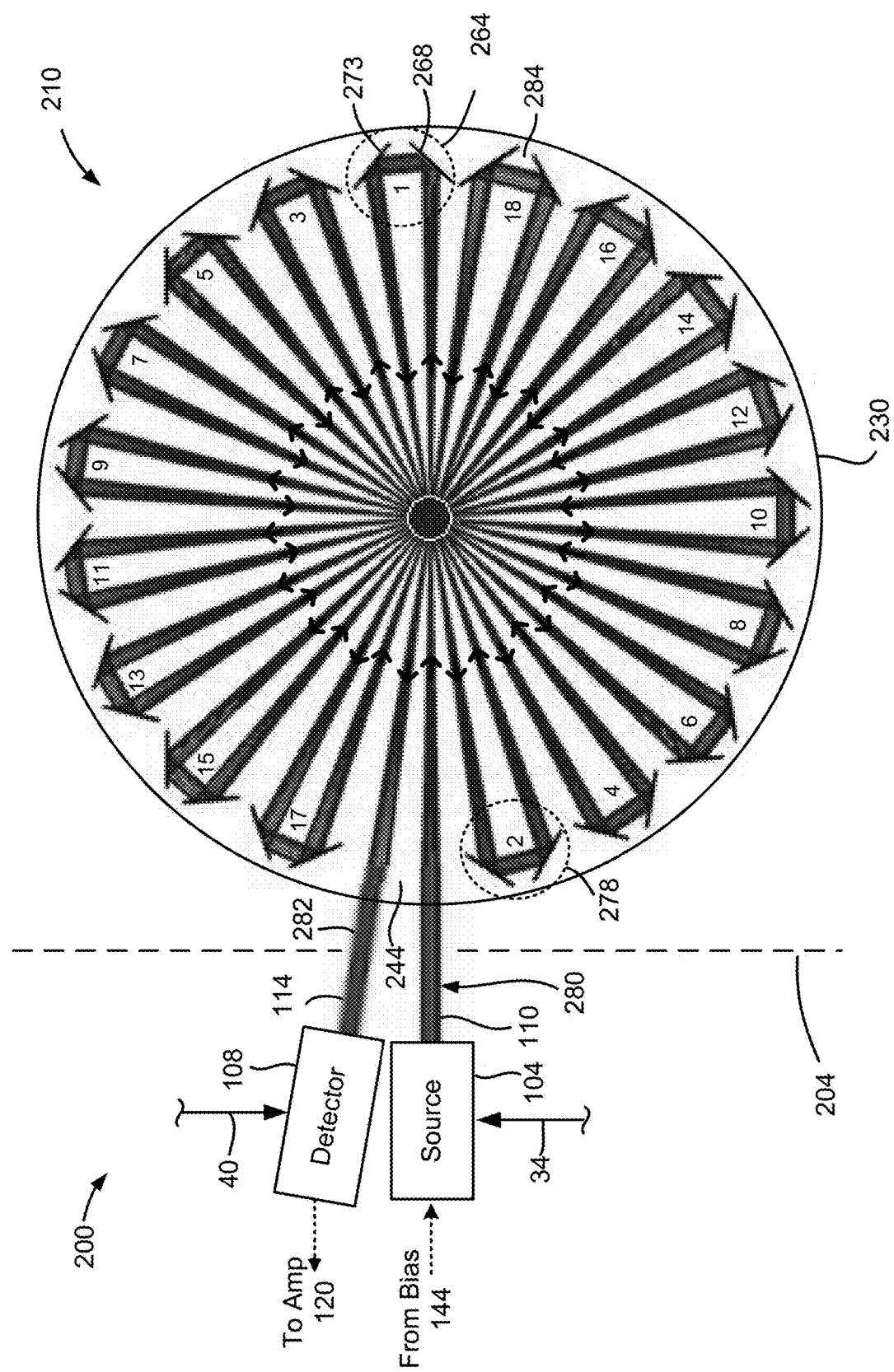
FIG. 3 is a further enlarged diagrammatic view of the multi-pass sampling apparatus of FIG. 2, shown here to illustrate further details of its structure and operation.

Referring to FIG. 3 in conjunction with FIG. 2, the former illustrates system 100 in a diagrammatic plan view with the addition of a beam path 280 that is propagated by the mirror pairs around the inner periphery of the annular support while sample interrogation apparatus 200 is partially shown as it interfaces with multi-pass sampling apparatus 210. It is noted that the mirror pairs are numbered in accordance with the sequence in which the path alternates across the sample region while stepping around the inner periphery of the annular support until an eighteenth mirror pair 284 directs the beam path through the sample to detector 108 as post-sample radiation 114 for detection. For purposes of clarity, arrowheads have been applied to segments of beam path 280 between the mirror pairs and the sample to show the direction of travel along each segment. Accordingly, pre-sample radiation 110 after initially passing through the sample region, travels in a sequence of alternating directions through the sample region at a plurality of different angles such that the source beam emerges as post-sample radiation 114 from aperture 244 (FIG. 2) of the annular support on a path segment 282 after having passed through the sample region and any sample contained therein a plurality of times. In this embodiment, it is noted that pre-sample radiation 110 and post-sample radiation 114 enter and exit, respectively, through a shared aperture in annular support 230. As is evident based on the shape of the beam path in FIG. 3, the mirrors of each mirror pair cooperate to focus post-sample radiation into sample holder 250 (FIG. 2) which then diverges after traveling through the sample region. In order to accomplish this, at least one mirror 268 or 273 of each mirror pair performs focusing as the radiation propagates. One suitable type of mirror for performing focusing, by way of a non-limiting example, is a toroidal mirror. In one embodiment, mirror 268 can be a flat mirror while mirror 273 is a focusing mirror. In another embodiment, mirror 268 can be a focusing mirror while mirror 273 is a flat mirror. In still another embodiment, both mirrors 268 and 273 can be focusing mirrors. Any suitable material can be used to form the mirrors including, but not limited to aluminum. It is noted that a lens can be provided, if needed, to focus pre-sample radiation 110 from source 104 to sample region 240 (FIG. 2). Applicant notes that there is no requirement for the beam path to move stepwise around essentially a complete circle as shown. That is, in some embodiments, there can be a greater angular offset between source 104 and detector 108 around the annular support such that fewer mirror pairs can be used. In this case, aperture 244 can serve as an entry point for pre-sampling radiation 110 and a separate aperture can be provided for post-sampling radiation 114.

Figure 4:
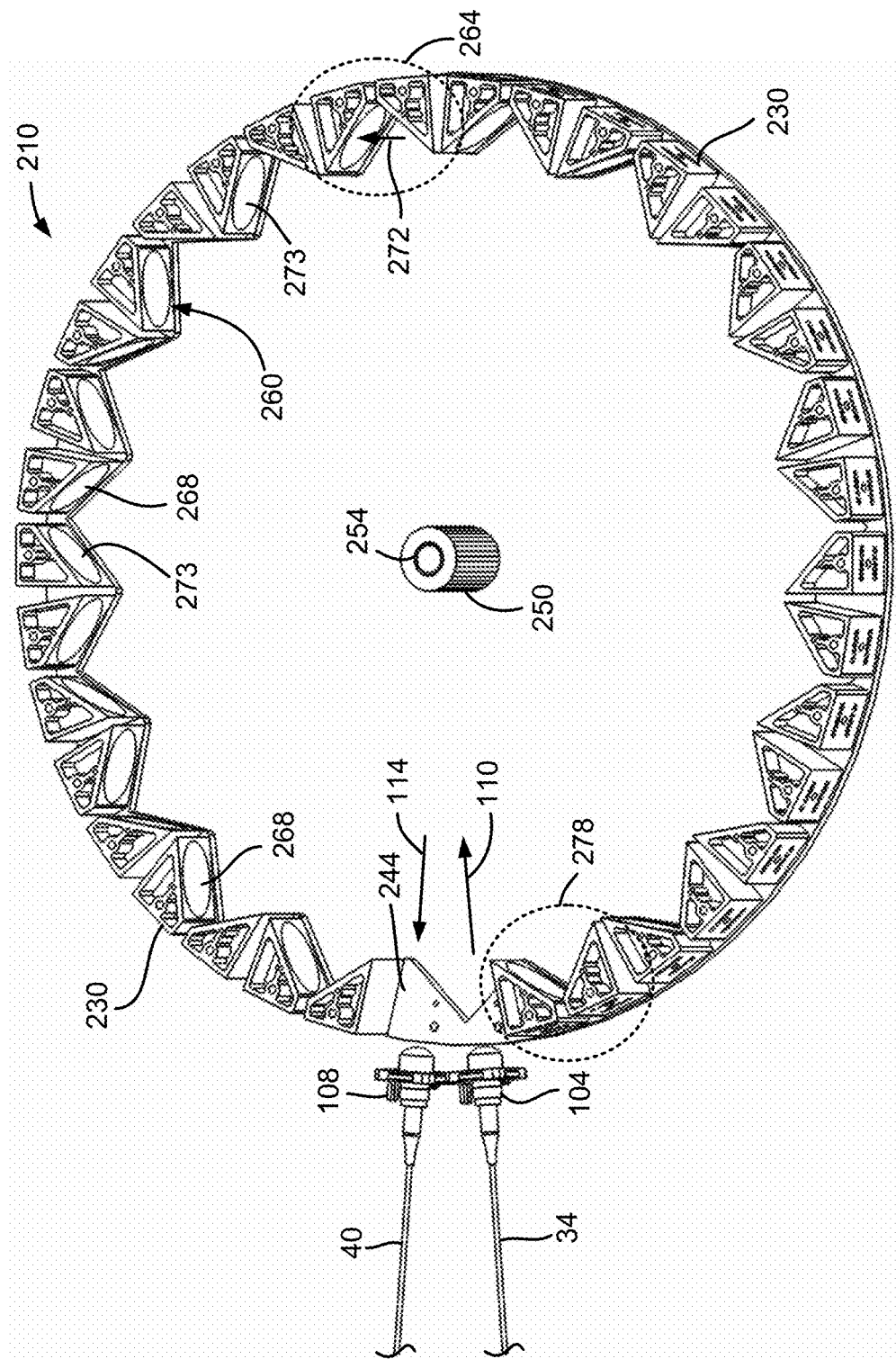
FIG. 4 is a diagrammatic view, in perspective, illustrating further details of an embodiment of the multi-pass sampling apparatus of FIGS. 2 and 3.

Attention is now directed to FIG. 4, which is a diagrammatic view, in perspective, illustrating further details of an embodiment of multi-pass sampling apparatus 210 of FIGS. 2 and 3. The reader is referred to the descriptions above with respect to designated features and components.

Figure 5:
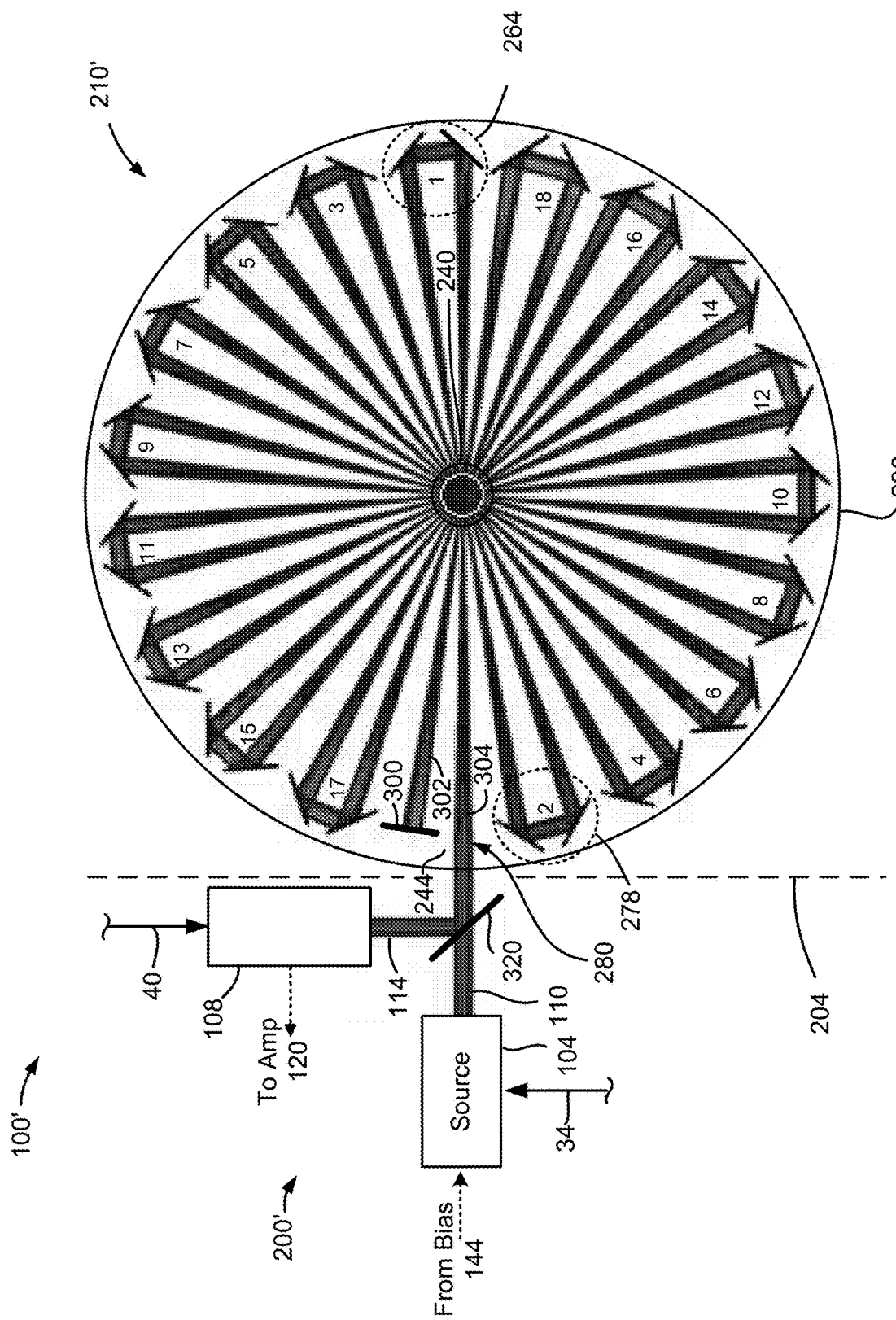
FIG. 5 is a diagrammatic illustration of an embodiment of a modified system that includes a modified multi-pass sampling apparatus in accordance with the present disclosure.

FIG. 5 is a diagrammatic illustration of an embodiment of a modified system 100' which includes a modified multi-pass sampling apparatus 210'. To the extent that system 100' and multi-pass sampling apparatus 210' share the features of previously described system 100 with respect to sample interrogation system 200 and multi-pass sampling apparatus 210, descriptions of such shared features will not be repeated and the reader is referred to the descriptions above. In system 100', multi-pass sampling apparatus 210' has been modified to include a reflector 300 that can be, for example, a mirror or a retro-reflector which reflects and focuses the post-sample radiation back to sample region 240 such that the radiation doubles back in a reverse direction to travel to aperture 244, doubling the length of the path as well as the number of times that the radiation travels through the sample. It is noted that the mirror pairs reflect the radiation in a reverse order for the reverse direction with respect to the numbering of the mirror pairs. In this embodiment, an optical splitter 320 is inserted into a path segment 304 as part of modified sample interrogation apparatus 200' such that post-sampling radiation 114 is deflected to detector 108, as shown, while pre-sampling radiation 110 travels from source 104 through the optical splitter to the sample region. Moreover, as compared to sample interrogation apparatus 200 of FIGS. 2 and 3, modified sample interrogation apparatus 200' illustrates source 104 and detector 108 rearranged in order to cooperate with the optical splitter. It should be appreciated that optical splitter 320 can be of any suitable type such as, for example, mylar. It is noted that arrows designating the direction of travel on individual segments of optical beam path 280 have been removed since the travel is bidirectional in this embodiment.

FIG. 6 is a diagrammatic illustration of a modified system 400 which includes a dual multi-pass sampling apparatus that is generally indicated by the reference number 410. To the extent that system 400 and dual multi-pass sampling apparatus 410 share the features of previously described system 100 of FIGS. 2-4 and system 100' of FIG. 6, descriptions of shared features will not be repeated and the reader is referred to the descriptions above. In system 400, modified sample interrogation system 200' of FIG. 5 is used. Further, multi-pass sampling apparatus 210 of FIG. 3 is used as a first multi-pass sampling apparatus in conjunction with the introduction of a mirror 414 on a segment 418 that formerly was received by the detector. Instead, a segment 420 bidirectionally extends the beam path to a second multi-pass sampling apparatus, which corresponds to modified multi-pass sampling apparatus 210' of FIG. 5, via a mirror 424. It is noted that mirrors 414 and 424 can be off-axis parabolic mirrors. Generally, multi-pass sampling apparatus 210 and modified multi-pass sampling apparatus 210' will be used with the same sample material in their respective sample regions. As compared to multi-pass sampling apparatus 210 of FIG. 3, dual multi-pass sampling apparatus 410 of FIG. 6 provides a path length that is four times longer and the beam path passes through the two combined sample regions four times as many times by connecting two multi-pass sampling apparatuses in series. It should be appreciated that any suitable number of such apparatuses can be connected in series in this manner and is not limited to two. In another embodiment, multi-pass sampling apparatus 210 and modified multi-pass sampling apparatus 210' can be arranged in a stacked configuration such that one major side of apparatus 210 is in a confronting relationship with another major side of apparatus 210' rather than in the illustrated side-by-side configuration. In this embodiment, mirrors 414 and 424 can be reoriented, as needed. Further, the sample regions of apparatus 210 and 210' are aligned in this stacked configuration such that the sample material can be shared, for example, within an elongated sample container extending between the two sampling apparatuses and configured in a manner that is consistent with the descriptions that follow.

Figure 8:
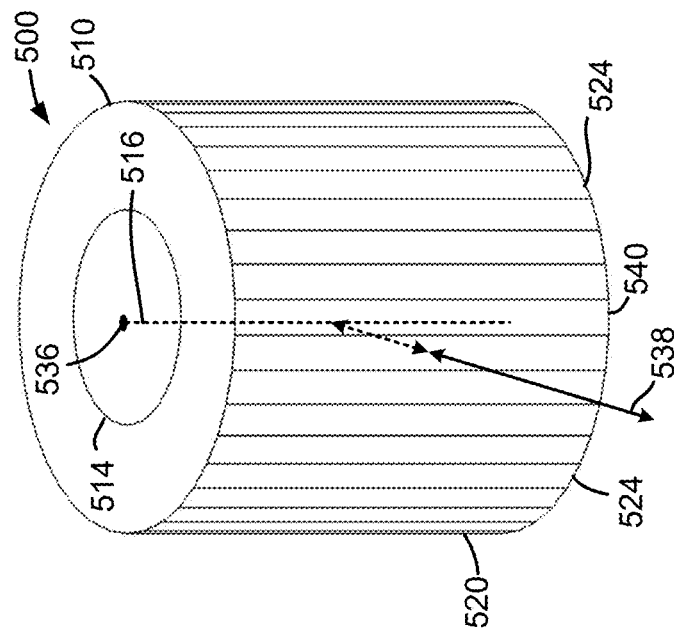
FIG. 8 is a further enlarged, diagrammatic view, in perspective, illustrating the embodiment of the micro-cell shown in FIG. 7.
Figure 7:
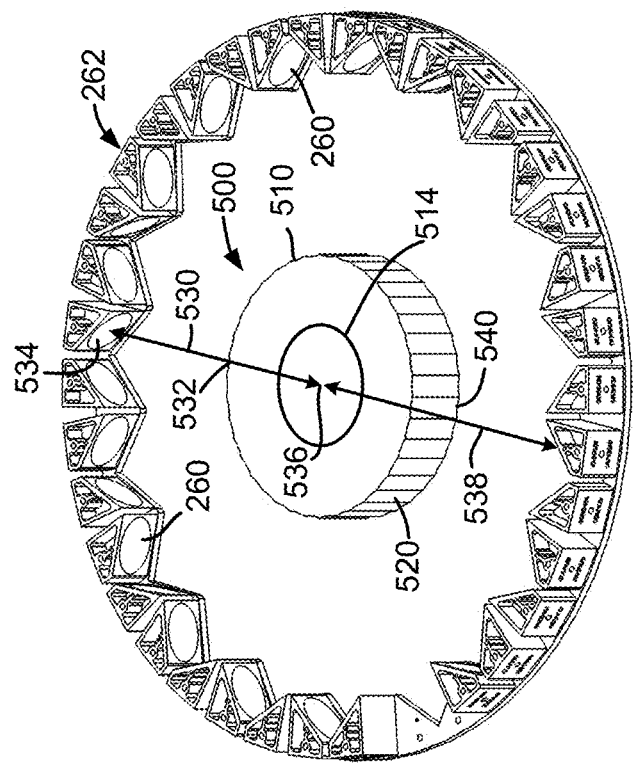
FIG. 7 is a diagrammatic view, in perspective, illustrating an embodiment of a multi-path mirror ring surrounding an embodiment of a micro-cell, each of which is produced in accordance with the present disclosure.

FIG. 7 is a diagrammatic view, in perspective, illustrating an embodiment of multi-path mirror ring 262 surrounding an embodiment of a micro-cell produced in accordance with the present disclosure, generally indicated by the reference number 500 and serving as the aforedescribed sample holder 250 of FIG. 2. FIG. 8 is a further enlarged diagrammatic view, in perspective, shown here to illustrate further details of micro-cell 500. In the present embodiment, micro-cell 500 includes a tubular shell 510 that is at least generally cylindrical and defines an interior that serves as a sample region 514 for receiving a sample. It is noted that, in the view of FIG. 7, the upper portion of the micro-cell has been truncated for purposes of clarity to better illustrate beam paths extending through the micro-cell. Applicant recognizes that configuring the micro-cell with essentially a perfectly cylindrical surface, such that a cross-sectional shape taken orthogonal to an axis 516 of the cylinder defines a circle, can produce undesired effects on propagation in the beam path (see, for example, FIG. 3) produced by multi-path mirror ring 262, since the micro-cell would function as a cylindrical lens, leading to excessive losses during propagation. While mirrors 260 can be designed to compensate for such effects of the outer periphery of the micro-cell as well as the periphery of sample region 514, Applicant recognizes that it is difficult to modify the mirrors for testing samples with different optical properties that can cause effects such as, for example, reflections to vary in an unpredictable way. In order to avoid these effects, Applicant configures tubular shell 510 with a faceted periphery 520 that is made up of a plurality of side-by-side facets 524, several of which are individually designated in FIG. 8, that are at least generally parallel to axis 516 of the micro-cell. In an embodiment, the facets can be flat or planar although any suitable shape can be used such that the energy traveling on the beam path is neither focused nor defocused. The outer periphery transverse to the length of the micro-cell can form a closed polygon having a plurality of sides that are all adjoined by an obtuse angle. FIG. 7 illustrates an individual beam path segment 530 that is centered on a facet 532 extending from the center of one mirror 534 to a focal point 536 at a center of sample region 514. Similarly, an opposing beam path segment 538 is shown in both FIGS. 7 and 8 in association with a facet 540.

Figure 10:
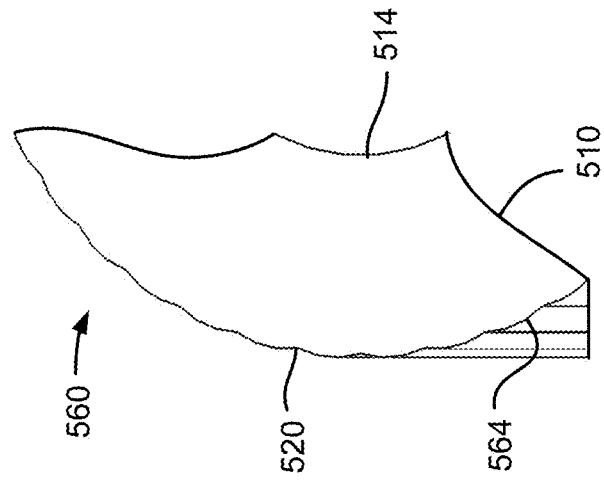
FIGS. 9 and 10 are diagrammatic, fragmentary views, in perspective, shown here to illustrate embodiments of a micro-cell having concave facets and convex facets, respectively, in accordance with the present disclosure.
Figure 9:
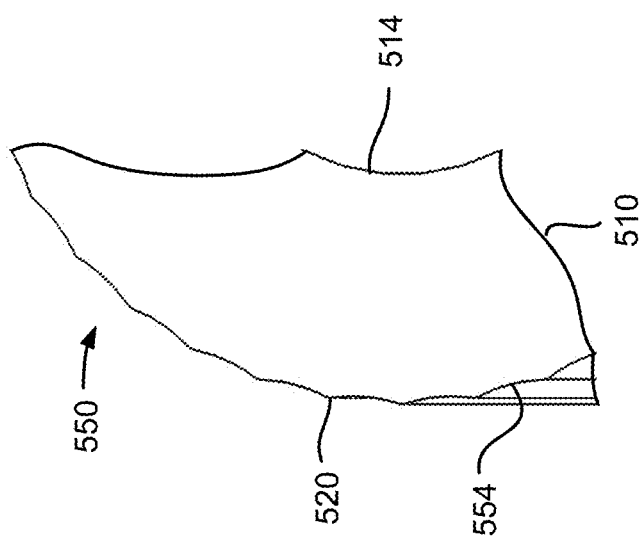

FIGS. 9 and 10 are diagrammatic, fragmentary views, in perspective shown here to illustrate an embodiment of the micro-cell, generally indicated by the reference number 550 in FIG. 9, having concave facets 554 and another embodiment of the micro-cell, generally indicated by the reference number 560 in FIG. 9, having convex facets 564. In another embodiment, tubular shell 510 can have a cylindrical outer periphery without facets and with mirrors 260 (see, for example, FIGS. 2 and 7) configured as spherical mirrors to complement the performance of the cylindrical shell (operating as a cylindrical lens) to focus beam path segments to the center of the sample region.

FIG. 11 is a diagrammatic illustration, in a perspective view, of an embodiment of a micro-cell produced in accordance with the present disclosure and generally indicated by the reference number 600. To the extent that the features of micro-cell 600 reflect the features of micro-cell 500 of FIGS. 8 and 9, descriptions of such features may not be repeated for purposes of brevity and the reader is referred to the descriptions above. In this embodiment, the sample region is configured as a nano-fluidic cell 604 that includes a plurality of nano-pores 610 for receiving a sample therein. FIG. 12 is a further enlarged diagrammatic, fragmentary view of a portion of the top/end surface of nano-fluidic cell 604 illustrating the potential appearance of individual nano-pores, several of which are designated by the reference number 614. The nano-pores comprise voids that have an elongated dimension extending at least generally along a direction that is parallel to axis 516 (FIG. 8) of the length of the micro-cell and are non-circular transverse to the elongated dimension. Moreover, the nano-pores are distributed along two orthogonal dimensions transverse to the length of the length of the nano-fluidic cell forming a two-dimensional shape in the visible, top surface of micro-cell 600.

While the configuration of systems in accordance with the present disclosure provide for multipath measurements of a solid material in a sample region, embodiments of micro-cell 600 provide for multi-path measurements of DNA and RNA samples within nano-pores 614. In this regard and by way of non-limiting example, terahertz spectroscopy is able to uniquely identify a range of molecules of interest, but because THz radiation is strongly absorbed by water, its use in characterization of biological samples has been limited. Applicant recognizes that nano-pores 614 alleviate issues with respect to the need for an aqueous solution. In particular, the nano-pores serve to concentrate a biologically important molecule while simultaneously limiting the amount of energy absorbing water. In this regard, nano-pores 614 are somewhat triangular in shape with arcuate sides. The cross sectional area of suitable nano-pores can be as small as 100 nm² It is noted that the specific shape of the nano-pores shown in FIG. 12 is not a requirement, as will be discussed at an appropriate point below. Unlike prior systems, micro-cell 600 as part of a system configured in accordance with the teachings herein, provides for multi-path exposure of a sample contained by the micro-pores to enhance the response of the system to the sample in a way that is submitted to be heretofore unknown. For example, Applicant believes that the response can be enhanced by an order of magnitude, as compared to conventional systems.

Still referring to FIGS. 11 and 12, an embodiment of micro-cell 600 can be produced through physically drawing a plurality of elongated cylindrical members such as, for example, rods and/or tubes. Such rods and/or tubes can be formed from any suitable material that can be drawn including but not limited to quartz, glass, plastic and polymers. Initially, these rods or tubes can be captured by a sheath 630 that is positioned within tubular shell 510. In the embodiment of FIGS. 11 and 12, solid rods can be used such as, by way of non-limiting example, optical fibers. This assembly can then be drawn as a preform under high temperature in the same manner that optical fibers are formed. Suitable materials for the rods/tubes and sheath include quartz or glass. It is noted that a polymer or plastic material may also be drawn in this manner. Nano-pores 614 form in the gaps between adjacent ones of the elongated members. The dimensions of nano-pores 614 are responsive to the diameter of the rods that are initially used. A rod end 634 is diagrammatically shown as a dashed circle in FIG. 12. If tubes are used having a central through opening, rather than rods, it is noted that the opening can close as a result of drawing. In another embodiment, nano-fluidic cell 604 can be formed as a component by drawing a preform with subsequent insertion into the opening defined by tubular shell 510. The nano-fluidic cell in such an embodiment can be held in position, for example, by a suitable adhesive such as, for example, epoxy. As will be seen, nano-pores can be formed in a wide variety of ways while remaining within the scope of the teachings of the present disclosure.

Applicant recognizes that because dielectrics are transparent in the THz regime, plastic or carbon tubes and/or rods can be employed to form a micro-cell without the need for drawing a preform. In such an embodiment, these tubes and/or rods can be bundled in a sheath material and/or by using a suitable adhesive. Such tubes and/or rods and can be coated with biologically active molecules to allow selective attachment to specific molecules. In other embodiments, photonic fibers that define passages that are sufficiently small so as to serve as nano-pores can be bundled to one another, for example, using a suitable adhesive such as, for example, an epoxy.

FIGS. 13a-13c diagrammatically illustrate the production and structure of another embodiment of a nano-fluidic cell in accordance with the present disclosure. FIG. 13a shows a preform, generally indicated by the reference number 700 and in a perspective view. In an embodiment, the materials that make up this preform can be quartz, although this is not a requirement. Preform 700 includes a core 704 that is a solid rod surrounded by an annular ring 708 of tubes, several of which are individually designated by the reference number 710 and each of which defines a center through hole. A shell 714 receives core 704 and annular ring 708 to capture these components in place for the drawing process. Heat 720, shown as arrows, is applied to draw the preform under the force of gravity in a well-known manner to form a drawn rod 724. FIG. 13b is a diagrammatic view, in perspective, illustrating the structure of a portion 730 of rod 724 proximate to a dashed circle 728 in FIG. 13a. FIG. 13c is a diagrammatic, fragmentary and further enlarged view of a portion of an end face 734 of rod portion 730 of FIG. 13b within a dashed circle 738 that is shown in FIG. 13b. In FIG. 13c, an annular ring of nano-pores 740 is formed that are circular transverse to the elongated length of rod portion 730. It is noted that additional nano-pores having essentially the same shape as nano-pores 614 of FIG. 12 can be formed, if desired, between rods 710 and dependent upon the diameter of the rods. In instances where these additional nano-pores are not wanted, a frit material or glass solder can be used in the preform to fill the space that would otherwise define the additional pores. In order to complete a micro-cell, rod portion 730 can be received in tubular shell 510 (see FIG. 11). In some embodiments, facets can be formed directly on shell 714, for example, during the drawing process through an appropriately shaped die to complete a micro-cell without the need for an additional tubular shell such that a tubular shell is essentially integrally formed. In view of FIGS. 13a-13c, it should be appreciated that a wide range of structures can be produced. For example, the diameter of core 704 can be adjusted to provide for the use of a greater or lesser number of rods, thereby changing the width of annular ring 740 of nano-pores. In order to control the amount of water in the micro-cell and as is the case with essentially all micro-cell embodiments, the number of nano-pores can be controlled responsive to suitable design factors such as, for example, the diameter of the core. In still another embodiment, core 704 can be eliminated such that shell 714 is completely filled or packed with tubes 710 or solid rods.

FIGS. 14a and 14b diagrammatically illustrate the production and structure for still another embodiment of a nano-fluidic cell in accordance with the present disclosure. FIG. 14a diagrammatically illustrates photonic fibers 750 assembled in a group in a perspective view. Photonic fibers 750 can include pores 754 that can be several microns in diameter. This bundle of photonic fibers can be bundled together in the manner of a preform. In an embodiment, the photonic fiber bundle can be contained within a shell such as, for example, shell 714 of FIGS. 13a-13c. FIG. 14b diagrammatically illustrates the resulting structure after drawing as a photonic fiber rod, generally indicated by the reference number 780, in a perspective view. An array 784 of sub-micron nano-tubes or nano-pores 786 is formed along a direction that is at least generally parallel to an elongated direction of the structure. An outline of one photonic fiber 788 is represented by a dashed circle in FIG. 14b. Of course, frit material or glass solder can be used as a filler to obtain a desired overall shape, as well as to fill gaps between adjacent photonic fibers In this way, heating and drawing can form a regular, smooth peripheral shape for insertion, for example, into tubular shell 510 of FIG. 11 to form a micro-cell. In some embodiments, facets can be formed directly on a periphery 790 of the resulting photonic rod, for example, during the drawing process through an appropriately shaped die to form a micro-cell without the need for an additional tubular shell, essentially with the tubular shell integrally formed.

Attention is now directed to FIG. 15 which illustrates an embodiment in an elevational diagrammatic, cut-away view of a nano-fluidic cell, generally indicated by the reference number 800. In this embodiment, nano-pores 804, a plurality of which are multi-dimensionally distributed and several of which are individually designated, extend along a length L of the nano-fluidic cell. In this embodiment, the end openings of nano-pores 804 are in communication with reservoirs 805 which contain a sample 810 therein such that sample 810 is also present in the nano-pores. Depending upon the particular application, electrodes 814 can be connected to a bias source 815 to apply an electric field to induce electrophoresis. Reservoirs 805 can be sealed by electrodes 814 or the reservoirs can be sealed separately with the electrodes applied as a separate component. In another embodiment which does not require reservoirs 805, sealing of the nano-pore openings can be accomplished in any suitable manner such as, for example, by using electrodes 814 sealed to the body of the nano-fluidic cell in a suitable manner such as, for example, by a rubber gasket. In still another embodiment, the nano-pore openings can be sealed by an end plate without utilizing electrodes 814, bias source 815 and reservoirs 805. These various embodiments demonstrate that a high degree of flexibility is envisioned for adapting the nano-fluidic cell to a particular application. As in all embodiments of the sample cell described herein, the sample can be any suitable material of interest such as, for example, a liquid, a gas and/or particles of a solid that are suspended. As noted above, the nano-pores can limit the amount of water to which the interrogating energy is exposed, thereby enhancing the system response to the sample of interest. Moreover, the sample cell can contain samples that would be detrimental to the remaining components of the system outside the sample cell, for example, causing corrosion. FIG. 16 illustrates another embodiment in an elevational diagrammatic, cut-away view of a nano-fluidic cell, generally indicated by the reference number 820. It is noted that descriptions of common features shared with the embodiment of FIG. 15 will not be repeated for purposes of brevity. In this embodiment, sample 810 flows through the nano-fluidic cell by entering an entry port 824 in a direction 828, shown by an arrow, into a first manifold 830 that is in communication with the nano-pores and exiting from the nano-pores into a second manifold 834 to then exit through an exit port 838 in a direction 840 that is indicated by an arrow. Again, electrodes 814 and power source 815 can be utilized although this is not a requirement. In the embodiment of FIG. 16, the electrodes can include apertures that are aligned with the nano-pores or the electrodes can be porous. In another embodiment, an electrode material can be supported by or form upper and lower manifolds 830 and 834, respectively.

Figure 1A:
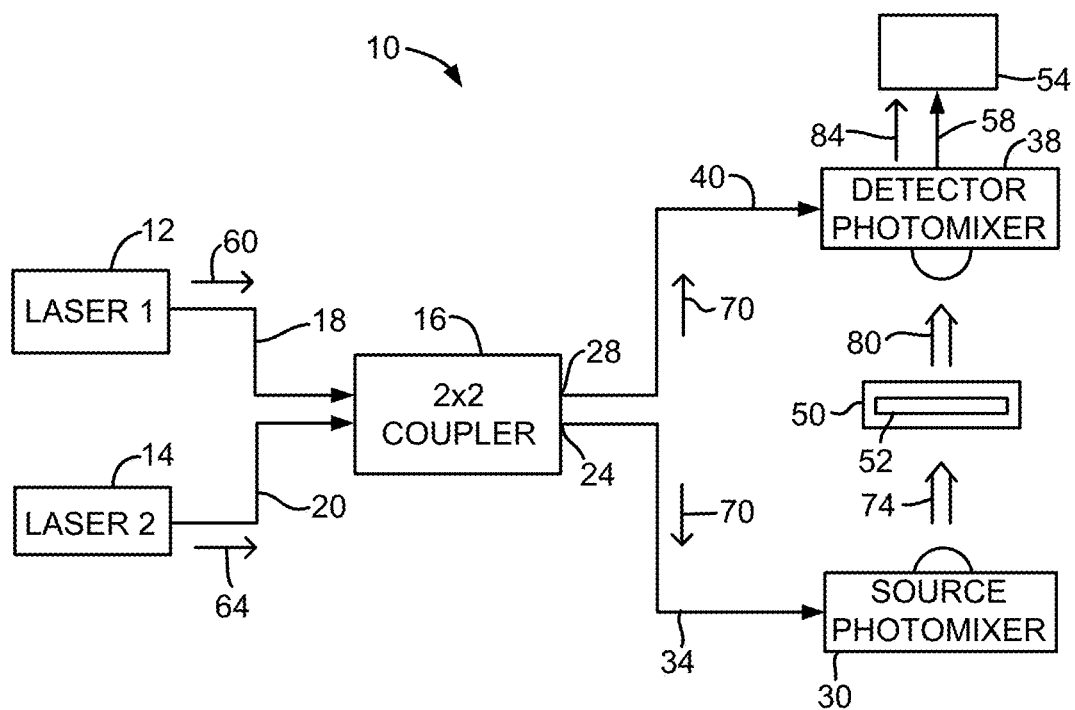
FIG. 1a is a block diagram of a prior art photomixing spectrometer system.
Figure 1B:
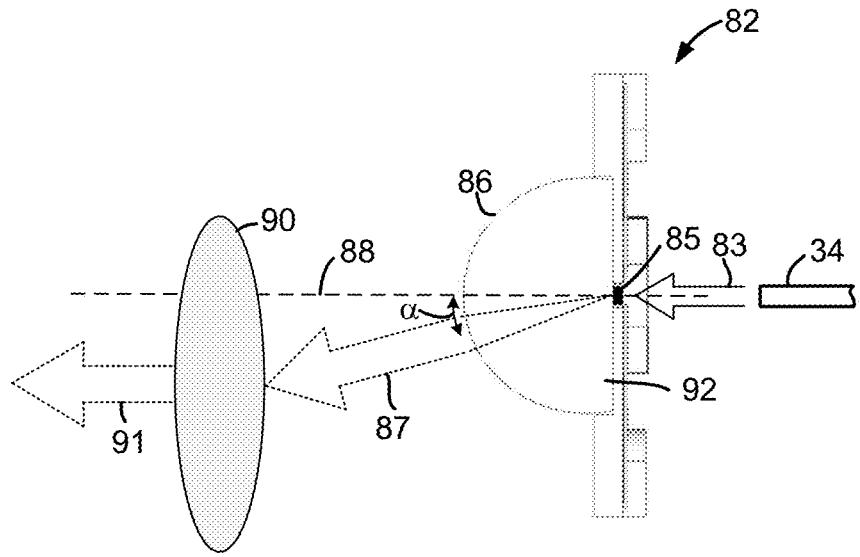

FIG. 17 is a diagrammatic, cut-away view, in elevation, of a photomixing device or package, generally indicated by the reference number 900. It is noted that device 900 can serve as either a source such as, for example, source 104 in FIG. 2 or as a detector such as, for example, detector 108 of the same figure. As will be further described, device 900 addresses Applicants' recognitions of certain deficiencies that were brought to light with respect to FIG. 1b.

Structurally, device 900 of FIG. 17 includes a base assembly 904 that supports a photomixer 908 or other suitable semiconductor device on a mounting surface 910 through which an electrical interface can be made via electrical connection pins 912. Photomixer 908 can be in optical communication 914, indicated as a double-headed arrow, with an external element. The external element can be optical fiber 34 (FIG. 2), by way of non-limiting example, on a light path 920 that extends to photomixer 908. A window 924 can be fixedly attached to a window mounting surface 928 in a suitable manner such as, for example, by using epoxy such that photomixer 908 can be in optical communication through the window. In this manner, the photomixer can be in direct physical contact with a confronting major surface of the window. An opposing major surface 930 of the window supports a lens 934 that is received in a pocket 938 that can be spaced apart from the periphery of the lens. The lens can include, for example, a cylindrical periphery 939 surrounding a circular, planar base such that the lens can be moved transversely in any given direction from a centered position. At least initially, lens 934 is slidably received against major surface 930 of the window for slidable movement up and down, as indicated by arrows 940a and 940b, respectively, as well as normal to (into and out of) the plane of the figure. By moving lens 934 laterally with respect to light path 920, the light path to the left of photomixer 908 can be adjusted, by way of example, from a misaligned light path 944, shown using a dashed arrow that is not aligned with light path 920 to an aligned light path 920', that aligns with light path 920 through the device. As noted above, misalignment between a fixed lens and photomixer 908 can result in misaligned light path 944, for example, responsive to mounting tolerances of a fixed lens and/or the photomixer itself. Of course, it should be appreciated that adjustments can be made to align light path 920' to essentially any desired direction and is not restricted to alignment with light path 920. Subsequent to performing the adjustment, lens 934 can be fixed into an adjusted position in any suitable manner such as, for example, by UV cure epoxy.

In FIG. 17, because the wavelength of radiation in device 900 such as, for example, THz radiation can be significantly longer than the potential gap between major surface 930 of the window and the planar surface of lens 934, this interface has no significant effect on the performance of the assembled device. Moreover, attaching lens 934 as a secondary process also allows for (in-the-field) customization, since the devices can be manufactured in bulk without installing a lens but with window 924 installed. In this way, any desired type of lens can be installed at a later date post-manufacture. In the present example, lens 934 is shown as a convex lens. In other embodiments, this lens can be a concave lens or a Fresnel lens. Once device 900 is aligned against a far-field reference 950 and locked in place, the need for a secondary lens (see FIG. 1b) or a mirror for redirection is eliminated. It is noted that for low temperature applications, where infrared (IR) radiation from the device is unwanted, embodiments can include a high-reflectivity optical coating that can be sputtered onto outwardly facing surface 930 of the window. This serves to prevent the IR from being transmitted along, for example, with THz radiation. The interface between window 924 and lens 934 can also support other coatings or materials in other embodiments that may normally be desired, for example, for a free-space THz beam such as a metal structure for polarization control or wavelength selectivity. In a particular embodiment, a thin section of Lithium Niobate can act as a THz wave-plate. Incorporating such features into this interface can decrease the number of external components that would otherwise be needed. It is noted that lens 924 and window 934 can be formed from any suitable material or materials including but not limited to silicon, sapphire, glass and polymer or combinations thereof and based on wavelength(s) of interest.

Still referring to FIG. 17 operation of photomixing package or assembly 900 will now be described serving as a photomixing source, for example, serving as source 104 in FIG. 2. In this configuration, optical fiber 34 (see FIG. 2) or some other suitable source emits a combined optical power 960 that is received by a port 964. The latter can be any suitable element such as, for example, a lens, an optical fiber interface or simply an aperture such that the optical power is incident on photomixer 908. In response to receiving the combined optical power, the photomixer mixes the optical power to produce an emitted radiation such as, for example, terahertz radiation. The emitted radiation propagates through the thickness of window 924 and is emitted into lens 934 such that emitted radiation 968, shown as a dotted arrow, leaves lens 934 along light path 920' based on prior adjustment of the position of lens 934. It is noted that emitted radiation 968 serves as a pre-sample radiation in FIG. 2.

Having described the operation of photomixing package or assembly serving as a photomixing source, its operation as a photomixing detector will now be described with reference to FIG. 18 which is the diagrammatic, cut-away view, in elevation, of aforedescribed device 900 or package of FIG. 17, but modified to show detection operation, for example, with device 900 serving as detector 108 of FIG. 2. In this configuration, a post-sample optical power 970 such as, for example, terahertz radiation that has passed through a sample a plurality of times, arrives at lens 934 along light path 920' that is aligned with light path 920 as a result of lens 934 being present in an adjusted position. It is noted that that the presence of misalignment, as can be seen in prior art implementations described with regard to FIG. 1b, wherein lens 934 is fixed in an incorrect, misaligned position, can result in post-sample optical power 970 being misdirected to a direction 974, represented by a dashed arrow at an angle with respect to light path 920' that can cause the optical power to partially or completely miss photomixer 908. Instead, lens 934 is positioned on window 924 to compensate for such misalignment such that post-sample optical power 970 is centered upon photomixer 908. At the same time, optical fiber 40 or some other suitable source emits combined optical power 960 (see FIG. 2) that is received by port 964. In response to receiving the optical power, the photomixer mixes the combined optical power and post-sample radiation 970 to produce an electrical output on pins 912 that is received by amplifier 120 of FIG. 2. In this way, the post-sample electromagnetic radiation is captured by the lens at an angular orientation that is adjustable responsive to sliding engagement of the lens on the window which changes the selective alignment and, thereafter, the optical power passes through the window to the semiconductor device.

In view of FIGS. 17 and 18, it should be appreciated that lens 934 can be selected, at least in part, based on the distribution at which the lens is desired to emit energy in FIG. 17 or to receive energy in FIG. 18.

FIG. 19 is a diagrammatic plan view of a modified photomixing device or package, generally indicated by the reference number 900' with the exception that lens 934 is supported for active movement against surface 930 of the window (FIGS. 17 and 18) by an XY translational stage 1000. Accordingly, descriptions of like components will not be repeated for purposes of brevity. The translational stage is supported by base assembly 904 such that an X actuator 1004 engages periphery 939 of lens 934 for bidirectional movement of the lens along one axis, as illustrated by a double-headed arrow 1008, and a Y actuator 1010 engages periphery 939 for independent bidirectional movement along another, orthogonal axis, as illustrated by a double-headed arrow 1014. The actuators of the translation stage can utilize any suitable form of mechanism for moving lens 934 including, but not limited to stepper motors, DC motors or piezoelectric elements. In this embodiment, a resilient member such as a spring or rubber gasket 1016 (FIGS. 17 and 18) can provide a force that biases the lens against surface 930 of the window to maintain contact.

Referring to FIG. 17 in conjunction with FIG. 19, translational stage 1000 permits adjustment of lens 934 such that light path 920' can be selectively aligned with any one of a number of targets 1020 (some of which are individually designated), arranged, for example, along an arc 1024. Directed energy incident on the targets is diagrammatically illustrated by dashed arrows 1028. Of course, arc 1024 can be achieved using a single actuator such that targets 1020 are in one plane. The use of XY translational stage 1000, however, allows for the distribution of targets in three dimensions. The targets can be of any suitable type such that the directed energy can be collected from, including but not limited to, free space, lenses, antennas and optical fibers.

Referring to FIG. 18 in conjunction with FIG. 19 in the context of a detection framework, translational stage 1000 permits adjustment of lens 934 such that light path 920' can be selectively aligned from any one of a number of sources 1030 (some of which are individually designated), arranged, for example, along arc 1024. Source energy from the sources is diagrammatically illustrated by dashed arrows 1034. As discussed above, arc 1024 can be achieved using a single actuator such that sources 1030 are in one plane. The use of XY translational stage 1000, however, allows for the distribution of the sources in three dimensions. The sources can be of any suitable type such that the source energy is receivable by lens 934 including but not limited to free space, lenses, antennas and optical fibers.

The foregoing description of the invention has been presented for purposes of illustration and description. It is not intended to be exhaustive or to limit the invention to the precise form or forms disclosed, and other modifications and variations may be possible in light of the above teachings wherein those of skill in the art will recognize certain modifications, permutations, additions and sub-combinations thereof.

What is claimed is:

1. An assembly, comprising: a port supported for accepting an optical power; a semiconductor device supported for receiving the optical power from the port and mixing the optical power to produce an emitted radiation; a window having first and second opposing major surfaces with a thickness therebetween and the window is fixedly supported adjacent to the semiconductor device to place the first opposing major surface in a confronting relationship with the semiconductor device for receiving the emitted radiation and the second opposing major surface is outwardly facing with respect to the semiconductor device such that the emitted radiation passes through the window and exits from the second opposing major surface; and a lens that is at least initially selectively positionable on the second, outwardly facing major surface of said window for selective alignment with the semiconductor device through the window based on sliding engagement between an input surface of the lens and the second opposing major surface of the window such that the emitted radiation enters the lens from the window and an angular orientation of the emitted radiation exiting from the lens is adjustable responsive to sliding engagement of the lens on the window which changes the selective alignment.

2. The assembly of claim 1 further comprising:
a translational stage for active adjustment of the angular orientation of the emitted radiation.

3. The assembly of claim 1 wherein the lens includes at least one of silicon, sapphire, glass and polymer.

4. The assembly of claim 1 wherein said lens is a convex lens.

5. The assembly of claim 1 wherein the semiconductor device is selected as one of a photomixer, a photoconductive switch or a diode.

6. The assembly of claim 1 wherein the second, outwardly facing surface of the window is planar.

7. The assembly of claim 6 wherein the input surface of the lens is planar for slidingly engaging the second, outwardly facing surface of the window.

8. The assembly of claim 1 further comprising a base assembly and wherein the first opposing major surface of the window is fixedly attached to the base assembly.

9. The assembly of claim 1 wherein the semiconductor device is in direct contact with the first opposing major surface of the window.

10. An assembly, comprising:
a semiconductor device supported for receiving electromagnetic radiation and generating an electrical signal based on the electromagnetic radiation;
a window having first and second opposing major surfaces with a thickness therebetween and the window is fixedly supported adjacent to the semiconductor device to place the first opposing major surface in a confronting relationship with the semiconductor device and the second opposing major surface is outwardly facing with respect to the semiconductor device; and
a lens that is at least initially selectively positionable on the second, outwardly facing major surface of said window for selective alignment with the semiconductor device through the window based on sliding engagement between a planar surface of the lens and the second opposing major surface,
wherein the electromagnetic radiation is captured by the lens at an angular orientation that is adjustable responsive to sliding engagement of the lens on the window which changes the selective alignment and, thereafter, the optical power passes through the window to the semiconductor device.

11. The assembly of claim 10 further comprising:
a translational stage for active adjustment of the angular orientation at which the electromagnetic radiation is captured.

12. The assembly of claim 10 wherein the lens includes at least one of silicon, sapphire, glass and polymer.

13. The assembly of claim 10 wherein said lens is a convex lens.

14. The assembly of claim 10 wherein the semiconductor device is selected as one of a photomixer, a photoconductive switch or a diode.

15. The assembly of claim 10 wherein the second, outwardly facing surface of the window is planar.

16. The assembly of claim 10 further comprising a base assembly and wherein the first opposing major surface of the window is fixedly attached to the base assembly.

17. The assembly of claim 10 wherein the semiconductor device is in direct contact with the first opposing major surface of the window.

18. The assembly of claim 10, further comprising:
a port for receiving an optical power such that the semiconductor device is exposed to the optical power for mixing the optical power with the electromagnetic radiation.

19. The assembly of claim 18 wherein the aforerecited electromagnetic radiation is a post-sample radiation characterizing a sample.

20. An assembly, comprising:
a port supported for accepting an optical power;
a semiconductor device supported for receiving the optical power from the port and mixing the optical power to produce an emitted radiation;
a window having first and second opposing major surfaces with a thickness therebetween and the window is fixedly supported adjacent to the semiconductor device to place the first opposing major surface in a confronting relationship with the semiconductor device for receiving the emitted radiation and the second opposing major surface is outwardly facing with respect to the semiconductor device with the emitted radiation passing through the window and exiting from the second opposing major surface for receiving a lens that is at least initially selectively positionable on the second, outwardly facing major surface of said window for selective alignment with the semiconductor device through the window based on sliding engagement between an input surface of the lens and the second opposing major surface of the window with the emitted radiation entering the lens from the window and an angular orientation of the emitted radiation exiting from the lens is adjustable responsive to sliding engagement of the lens on the window which changes the selective alignment.

21. An assembly, comprising:
a semiconductor device supported for receiving electromagnetic radiation and generating an electrical signal based on the electromagnetic radiation;
a window having first and second opposing major surfaces with a thickness therebetween and the window is fixedly supported adjacent to the semiconductor device to place the first opposing major surface in a confronting relationship with the semiconductor device and the second opposing major surface is outwardly facing with respect to the semiconductor device for receiving a lens that is at least initially selectively positionable on the second, outwardly facing major surface of said window for selective alignment with the semiconductor device through the window based on sliding engagement between a planar surface of the lens and the second opposing major surface, wherein the electromagnetic radiation is captured by the lens at an angular orientation that is adjustable responsive to sliding engagement of the lens on the window which changes the selective alignment and, thereafter, the optical power passes through the window to the semiconductor device.

* * * * *